(12) United States Patent
Shin et al.

(10) Patent No.: US 11,387,367 B2
(45) Date of Patent: Jul. 12, 2022

(54) SEMICONDUCTOR DEVICES AND METHODS OF MANUFACTURING THE SAME

(71) Applicant: Samsung Electronics Co., Ltd., Suwon-si (KR)

(72) Inventors: Woocheol Shin, Seoul (KR); Sunggi Hur, Hwaseong-si (KR); Sangwon Baek, Hwaseong-si (KR); Junghan Lee, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/034,421

(22) Filed: Sep. 28, 2020

(65) Prior Publication Data

US 2021/0257499 A1 Aug. 19, 2021

(30) Foreign Application Priority Data

Feb. 17, 2020 (KR) .................. 10-2020-0018853

(51) Int. Cl.
| | |
|---|---|
| *H01L 29/786* | (2006.01) |
| *H01L 29/06* | (2006.01) |
| *H01L 29/423* | (2006.01) |
| *H01L 21/02* | (2006.01) |
| *H01L 29/66* | (2006.01) |

(52) U.S. Cl.
CPC .. *H01L 29/78618* (2013.01); *H01L 21/02236* (2013.01); *H01L 21/02532* (2013.01); *H01L 21/02603* (2013.01); *H01L 29/0673* (2013.01); *H01L 29/42392* (2013.01); *H01L 29/66545* (2013.01); *H01L 29/66636* (2013.01); *H01L 29/66742* (2013.01); *H01L 29/78696* (2013.01)

(58) Field of Classification Search
CPC ......... H01L 21/02236; H01L 21/02532; H01L 21/02603; H01L 29/0673; H01L 29/42392; H01L 29/66545; H01L 29/66636; H01L 29/66742; H01L 29/78696
USPC ........................................................ 257/347
See application file for complete search history.

(56) References Cited

U.S. PATENT DOCUMENTS

| | | |
|---|---|---|
| 10,297,664 B2 | 5/2019 | Xie |
| 10,355,102 B2 | 7/2019 | Cheng et al. |
| 10,374,059 B2 | 8/2019 | Cheng et al. |

(Continued)

*Primary Examiner* — Tong-Ho Kim
(74) *Attorney, Agent, or Firm* — Harness, Dickey & Pierce, P.L.C.

(57) ABSTRACT

A semiconductor device includes channels, a gate structure, and a source/drain layer. The channels are stacked in a vertical direction. Each channel extends in a first direction. The gate structure extends in a second direction. The gate structure covers the channels. The source/drain layer is connected to each of opposite sidewalls in the first direction of the channels on the substrate, and includes a doped semiconductor material. The source/drain layer includes first and second epitaxial layers having first and second impurity concentrations, respectively. The first epitaxial layer covers a lower surface and opposite sidewalls in the first direction of the second epitaxial layer. A portion of each of opposite sidewalls in the first direction of the gate structure protrudes in the first direction from opposite sidewalls in the first direction of the channels to partially penetrate through the first epitaxial layer but not to contact the second epitaxial layer.

20 Claims, 39 Drawing Sheets

(56) References Cited

U.S. PATENT DOCUMENTS

| | | |
|---|---|---|
| 2014/0151638 A1 | 6/2014 | Chang et al. |
| 2018/0175035 A1 | 6/2018 | Yang et al. |
| 2019/0148489 A1 | 5/2019 | Bhuwalka et al. |
| 2019/0165157 A1 | 5/2019 | Yang et al. |
| 2019/0267494 A1 | 8/2019 | Kim et al. |
| 2021/0126135 A1* | 4/2021 | Lee .................. H01L 29/42392 |

* cited by examiner

FIG. 7
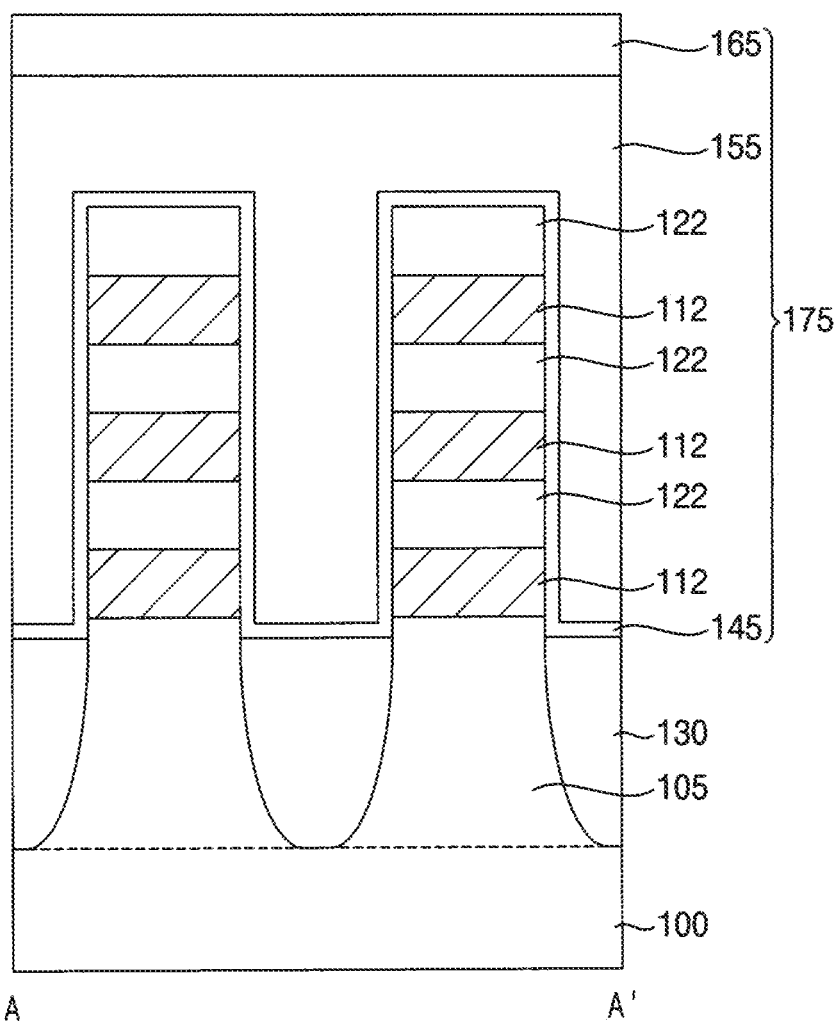
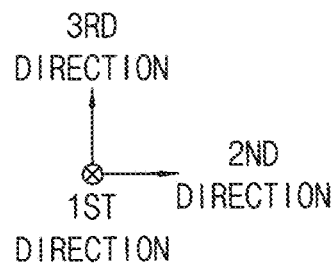

FIG. 27
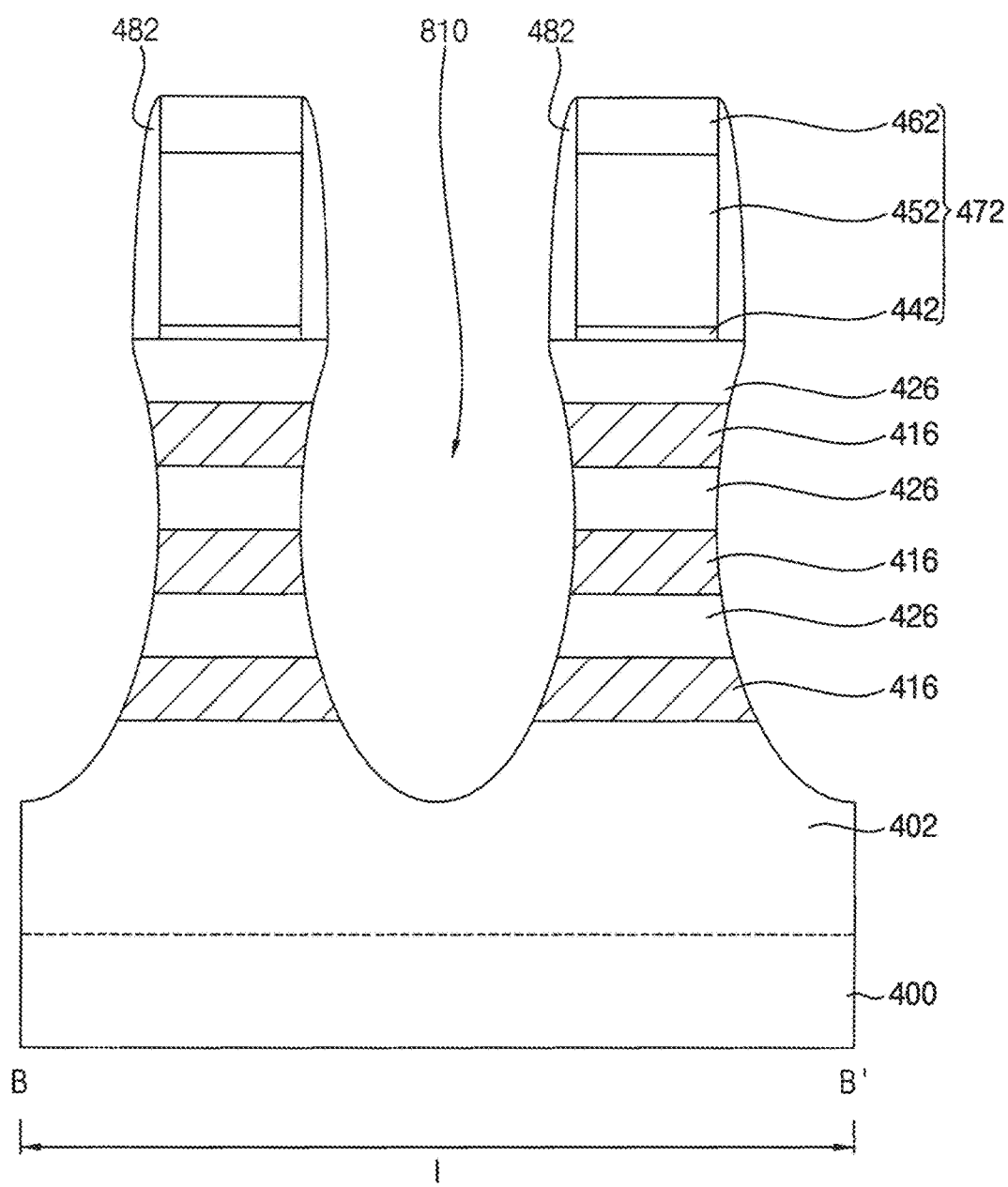
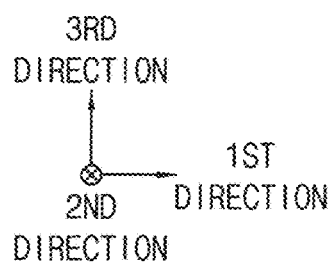

FIG. 28
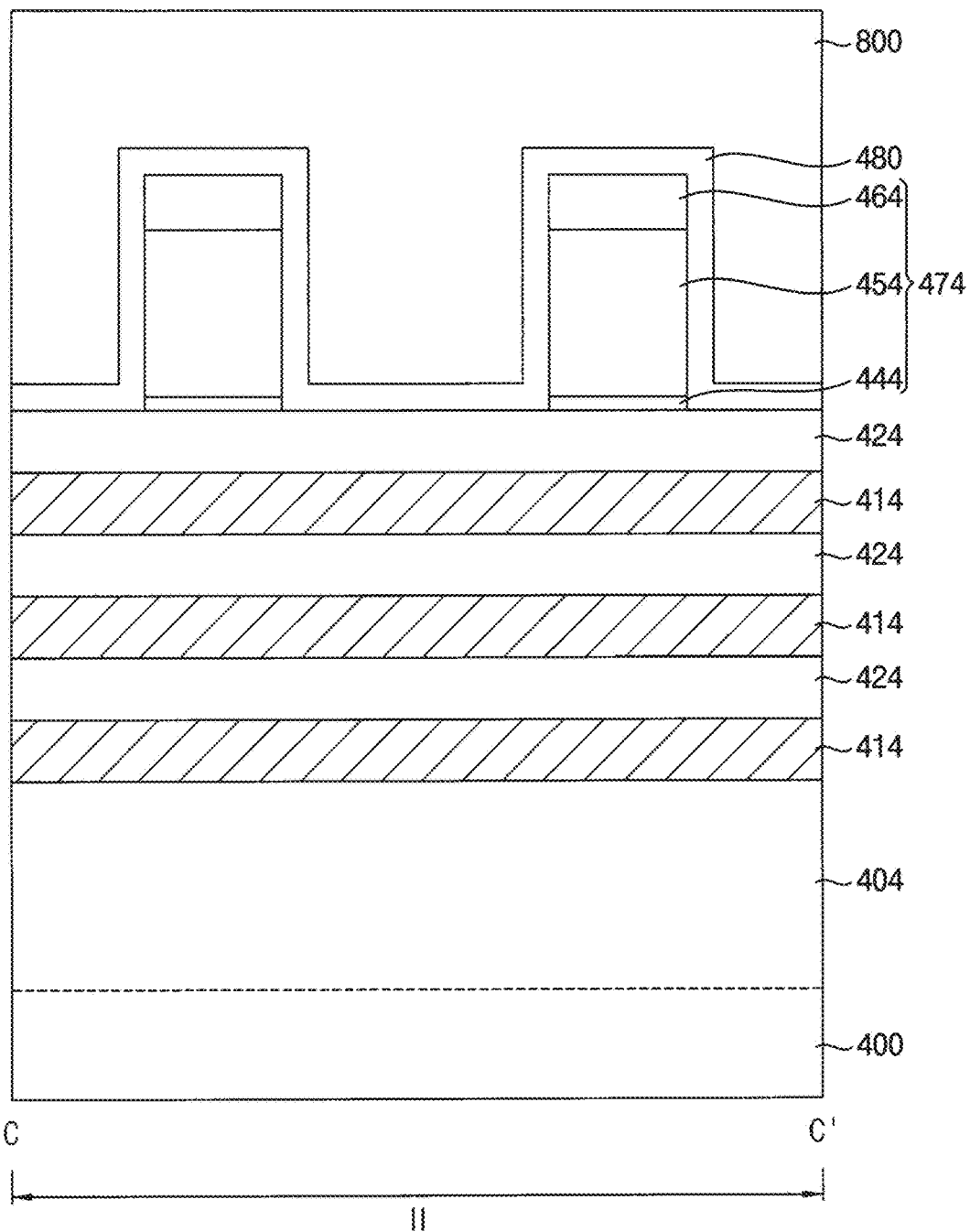
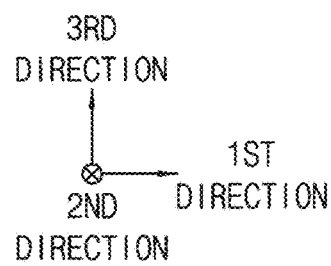

SEMICONDUCTOR DEVICES AND METHODS OF MANUFACTURING THE SAME

CROSS-REFERENCE TO RELATED APPLICATION

This application claims priority under 35 USC § 119 to Korean Patent Application No. 10-2020-0018853, filed on Feb. 17, 2020 in the Korean Intellectual Property Office (KIPO), the contents of which are herein incorporated by reference in their entirety.

BACKGROUND

Some example embodiments relate to semiconductor devices and/or methods of manufacturing the same. More particularly, some example embodiments relate to semiconductor devices having a plurality of channels stacked in a vertical direction and/or methods of manufacturing the same.

When a multi-bridge channel field effect transistor (MBCFET) including a plurality of channels vertically stacked is fabricated/manufactured, a sacrificial layer and a channel layer may be alternately and repeatedly stacked to form a stacked structure, source/drain layers may be formed at opposite sides of the stacked structure, respectively, the sacrificial layers may be removed to form gaps, respectively, and a gate structure may be formed to fill the gaps. When the sacrificial layers are removed, if residue of and/or portions of the sacrificial layers remains on surfaces of the source/drain layers, interface characteristics of the source/drain layers may be deteriorated.

SUMMARY

Some example embodiments provide a semiconductor device having enhanced characteristics.

Some example embodiments provide a method of manufacturing a semiconductor device having enhanced characteristics.

According to some example embodiments, there is provided a semiconductor device including a substrate, channels spaced apart from each other in a vertical direction that is perpendicular to an upper surface of the substrate, each of the channels extending in a first direction that is parallel to the upper surface of the substrate, a gate structure extending on the substrate in a second direction, the second direction parallel to the upper surface of the substrate and crossing the first direction, the gate structure covering lower surfaces, upper surfaces, first sidewalls, and second sidewalls of the channels, the first sidewalls of the channels opposite the second sidewalls of the channels in the second direction; and a source/drain layer on the substrate, the source/drain layer being connected to each of the first sidewalls of the channels and the second sidewalls of the channels in the first direction of the channels, the source/drain layer including a semiconductor material having impurities. The source/drain layer includes a second epitaxial layer having a second impurity concentration, and a first epitaxial layer covering a lower surface of the second epitaxial layer and covering first and second sidewalls in the first direction of the second epitaxial layer, the first and second sidewalls of the second epitaxial layer opposite in the first direction, the first epitaxial layer having a first impurity concentration less than the second impurity concentration. A portion of each of first and second sidewalls of the gate structure in the first direction protrudes in the first direction from corresponding ones of first sidewalls and second sidewalls of the channels in the first direction to penetrate through a portion of the first epitaxial layer but not to contact the second epitaxial layer.

According to some example embodiments, there is provided a semiconductor device including channels spaced apart from each other in a vertical direction perpendicular to an upper surface of a substrate, each of the channels extending in a horizontal direction parallel to the upper surface of the substrate, a gate structure on the substrate, the gate structure partially covering each of the channels, and a source/drain layer on the substrate, the source/drain layer connected to each of a first sidewall and a second sidewall of the channels, the first sidewall of the channel opposite the second sidewall of the channel in the horizontal direction, the source/drain layer including a semiconductor material having impurities. The source/drain layer includes a second epitaxial layer having a second impurity concentration, and a first epitaxial layer covering a lower surface and first and second sidewalls of the second epitaxial layer, the first sidewall of the first epitaxial layer opposite the second sidewall of the first epitaxial layer in the first direction, the first epitaxial layer having a first impurity concentration less than the second impurity concentration. A length in the horizontal direction of a portion of the gate structure between corresponding ones of the channels that neighbor in the vertical direction is greater than each of the lengths in the horizontal direction of the corresponding ones of the channels that neighbor in the vertical direction, and each of first and second sidewalls of the portion of the gate structure does not contact the second epitaxial layer, the first and second sidewalls of the portion of the gate structure opposite in the horizontal direction.

According to some example embodiments, there is provided a semiconductor device including (A) a first transistor including (i) first channels on a first region of a substrate including the first region and a second region, the first channels spaced apart from each other in a vertical direction perpendicular to an upper surface of the substrate, each of the first channels extending in a horizontal direction parallel to the upper surface of the substrate, (ii) a first gate structure on the first region of the substrate, the first gate structure partially covering each of the first channels, and (iii) a first source/drain layer on the first region of the substrate, the first source/drain layer connected to each of a first sidewall and a second sidewall of the first channels, the first sidewall of the first channels opposite the second sidewall of the first channels in the horizontal direction, the first source/drain layer including a semiconductor material having impurities of a first conductivity type, and the first source/drain layer including, (a) a second epitaxial layer having a second impurity concentration, and (b) a first epitaxial layer covering a lower surface and first and second sidewalls of the second epitaxial layer, the first and second sidewalls of the second epitaxial layer opposite in the horizontal direction, the first epitaxial layer having a first impurity concentration less than the second impurity concentration. The semiconductor device further includes (B) a second transistor including (i) second channels on the second region of the substrate, the second channels spaced apart from each other in the vertical direction, each of the second channels extending in the horizontal direction, (ii) a second gate structure on the second region of the substrate, the second gate structure partially covering each of the second channels, and (iii) a second source/drain layer on the second region of the substrate, the second source/drain layer connected to each of a first sidewall and a second sidewall of the second channels, the first sidewall of the second channel opposite the second sidewall of the second channel in the horizontal direction, the second source/drain layer including a semiconductor material having impurities of a second conductivity type different from the first conductivity type, and the second source/drain layer including, (a) a fourth epitaxial layer having a fourth impurity concentration, and (b) a third epitaxial layer covering a lower surface and first and second sidewalls of the fourth epitaxial layer, the first and second sidewalls of the fourth epitaxial layer, the third epitaxial layer having a third impurity concentration less than the fourth impurity concentration. A portion of each of first and second sidewalls of the first gate structure protrudes in the horizontal direction from corresponding ones of first and second sidewalls of the first channels to penetrate through a portion of the first epitaxial layer but not to contact the second epitaxial layer, and a portion of each of first and second sidewalls the second gate structure protrudes in the horizontal direction from corresponding ones of first and second sidewalls of the second channels to penetrate through a portion of the third epitaxial layer but do not contact the fourth epitaxial layer, the first and second sidewalls of the first gate structures opposite in the horizontal direction, the first and second sidewalls of the first channels opposite in the horizontal direction, the first and second sidewalls of the second gate structures opposite in the horizontal direction, and the first and second sidewalls of the second channels opposite in the horizontal direction.

According to some example embodiments, there is provided a method of manufacturing a semiconductor device including forming a fin structure, the fin structure including sacrificial lines and semiconductor lines that are alternately and repeatedly stacked in a vertical direction, the vertical direction perpendicular to an upper surface of a substrate, forming a dummy gate structure on the substrate covering a portion of the fin structure, removing a portion of the fin structure at each of first and second sides of the dummy gate structure to form a first opening, the first and second sides opposite, forming a source/drain layer in the first opening, forming an insulating interlayer on the substrate covering the dummy gate structure and the source/drain layer, removing the dummy gate structure and the sacrificial lines to form second and third openings, respectively, the third opening exposing a portion of a sidewall of the source/drain layer, oxidizing the exposed portion of the sidewall of the source/drain layer to form an oxide layer, removing the oxide layer to form a fourth opening, the fourth opening having an enlarged width greater than a width of the third opening, the width of the third opening and the fourth opening in a horizontal direction that is parallel to the upper surface of the substrate, and forming a gate structure in the second and fourth openings.

According to some example embodiments, there is provided a method of manufacturing a semiconductor device including forming a structure including sacrificial patterns and semiconductor patterns that are alternately and repeatedly stacked in a vertical direction that is perpendicular to an upper surface of a substrate, forming a source/drain layer at each of a first side and a second side of the structure, the first side opposite the second side, removing the sacrificial patterns to form a first opening exposing a portion of a sidewall of the source/drain layer, oxidizing the exposed portion of the sidewall of the source/drain layer to form an oxide layer, removing the oxide layer to form a second opening having an enlarged width greater than a width of the first opening, the width of the first opening and the second opening in a horizontal direction that is parallel to the upper surface of the substrate, and forming a gate structure in the second opening.

In the semiconductor device in accordance with some example embodiments, the length of the gate structure contacting the source/drain layer may increase, and thus the leakage current may be reduced, and/or the control of the gate structure on the channel may be enhanced. Additionally or alternatively, residue on the surface of the source/drain layer may be removed or at least partially removed to improve the interface characteristics of the source/drain layer.

BRIEF DESCRIPTION OF THE DRAWINGS

FIGS. 4 to 16 are plan views and cross-sectional views illustrating a method of manufacturing a semiconductor device in accordance with some example embodiments.

FIGS. 21 to 39 are plan views and cross-sectional views illustrating a method of manufacturing a semiconductor device in accordance with some example embodiments.

DESCRIPTION OF EXAMPLE EMBODIMENTS

A semiconductor device and/or a method of manufacturing the same in accordance with some example embodiments will be described more fully hereinafter with reference to the accompanying drawings.

Figure 1:
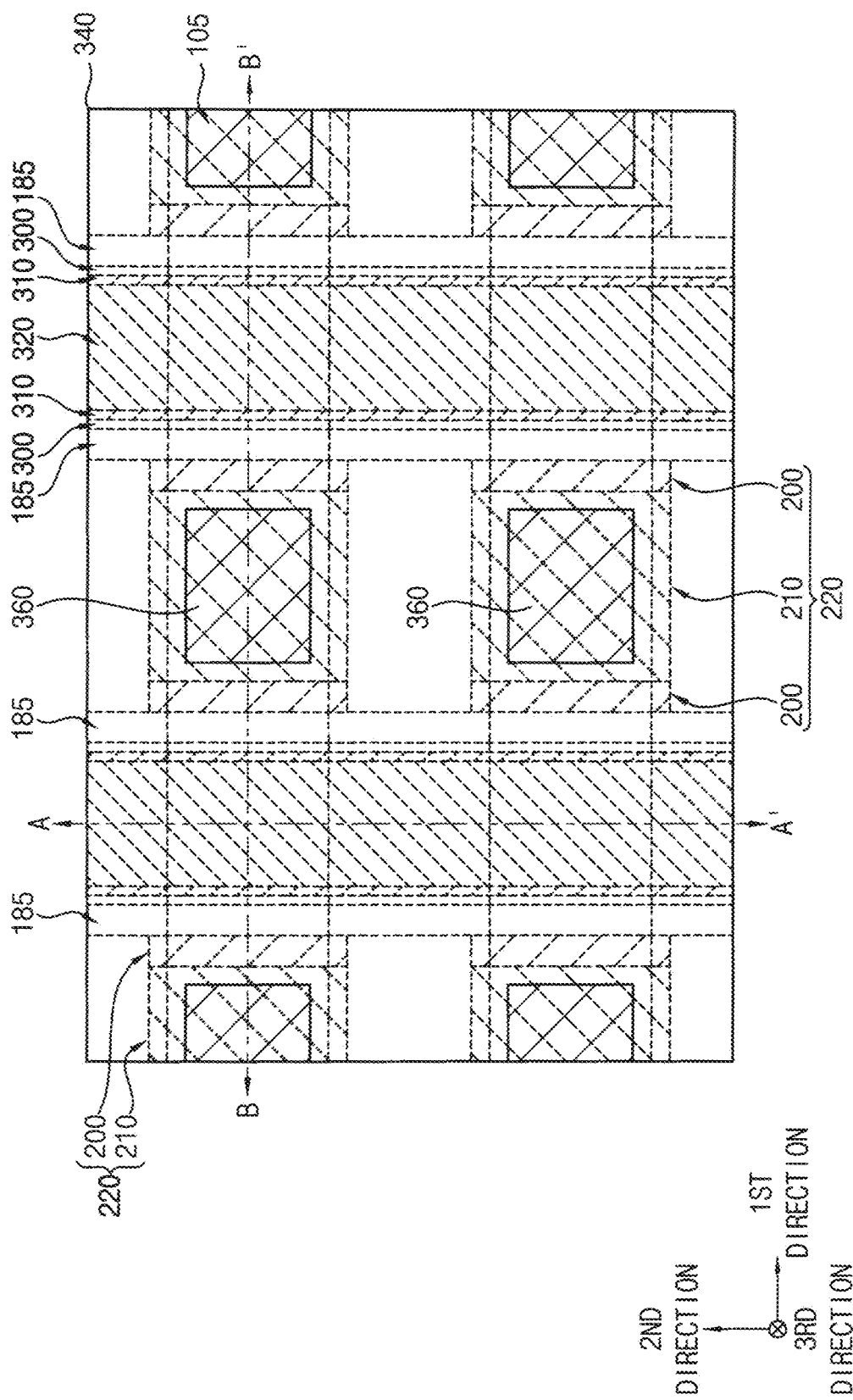
FIGS. 1 to 3 are a plan view and cross-sectional views illustrating a semiconductor device in accordance with some example embodiments.
Figure 2:
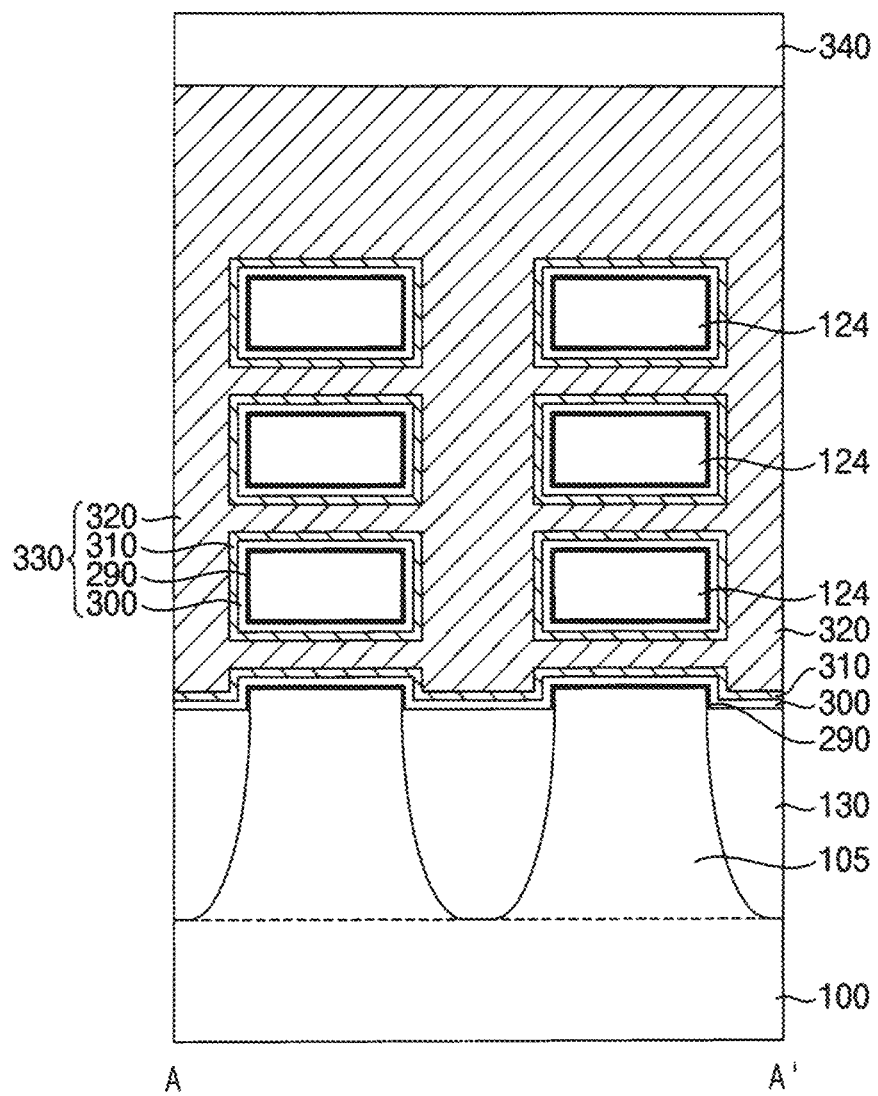
Figure 3:
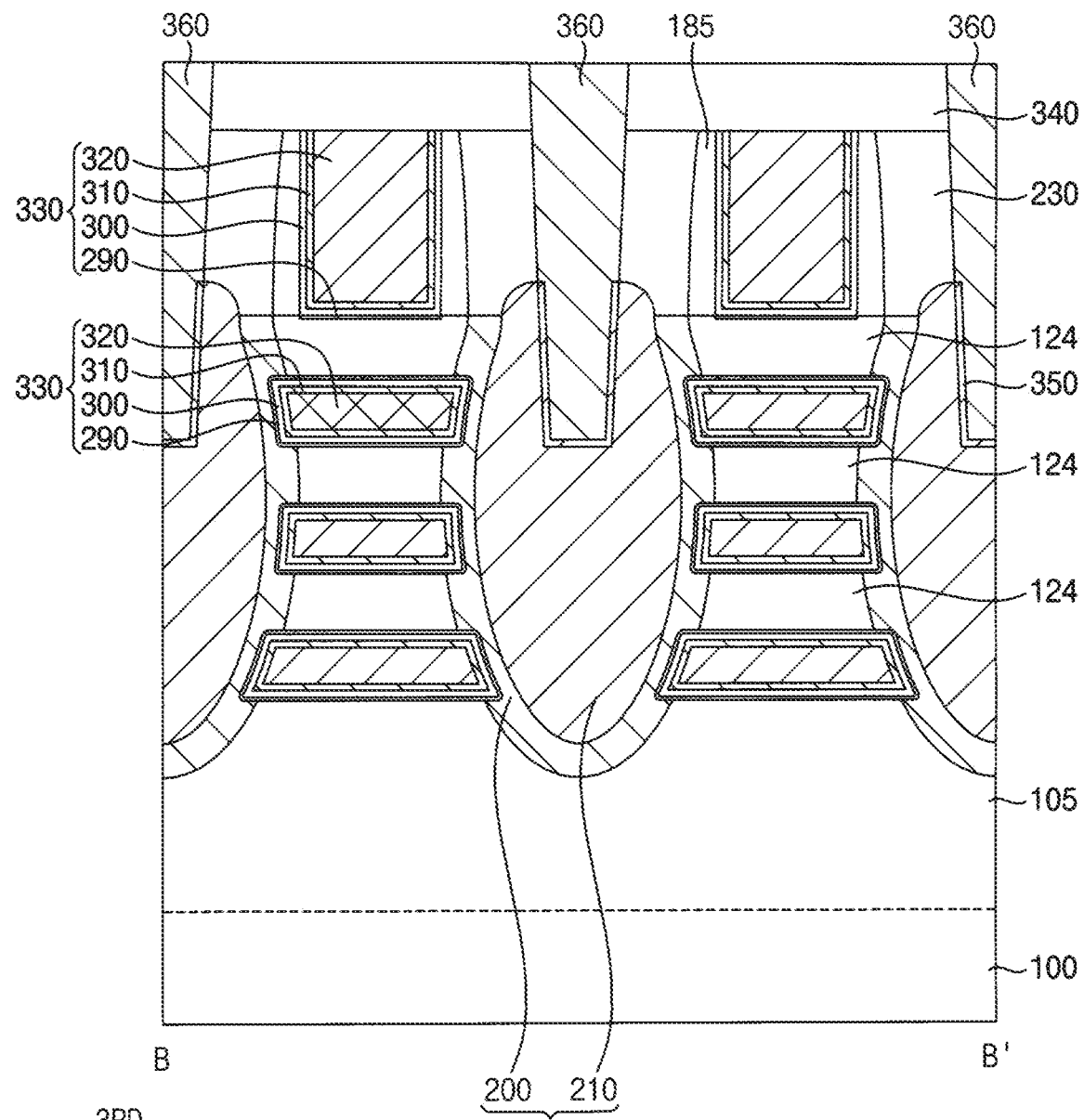

FIGS. 1 to 3 are a plan view and cross-sectional views illustrating a semiconductor device in accordance with some example embodiments. FIG. 1 is the plan view, FIG. 2 is a cross-sectional view taken along a line A-A' of FIG. 1, and FIG. 3 is a cross-sectional view taken along a line B-B' of FIG. 1.

Hereinafter, two directions substantially parallel to an upper surface of the substrate and crossing each other may be referred to as first and second directions, respectively, and a direction substantially perpendicular to the upper surface of the substrate may be referred to as a third direction. In some example embodiments, the first and second directions may be substantially perpendicular to each other.

Referring to FIGS. 1 to 3, the semiconductor device may include an active pattern 105, a gate structure 330, a semiconductor pattern 124, and a source/drain layer 220 on a substrate 100. The semiconductor device may further include a gate spacer 185, an isolation pattern 130, a metal silicide pattern 350, a contact plug 360, and first and second insulating interlayers 230 and 340.

The substrate 100 may include a semiconductor material, at least one of e.g., silicon, germanium, silicon-germanium, etc., or III-V semiconductor compounds, e.g., GaP, GaAs, GaSb, etc. The substrate 100 may be or include a Silicon-On-Insulator (SOI) substrate.

The active pattern 105 may protrude from the substrate 100 in the third direction, and may extend in the first direction. In the drawings, only two active patterns 105 are shown, however, inventive concepts may not be limited thereto, and more than two active patterns 105 may be spaced apart from each other in the second direction. The active pattern 105 may be formed by removing an upper portion of the substrate 100, and thus may include a material substantially the same as that of the substrate 100.

A sidewall of the active pattern 105 in the second direction may be covered by the isolation pattern 130. The isolation pattern 130 may include an oxide, e.g., silicon oxide.

In some example embodiments, a plurality of semiconductor patterns 124 may be formed at a plurality of levels, respectively. The plurality of semiconductor patterns 124 may be spaced apart from each other in the third direction from an upper surface of the active pattern 105, and each of the semiconductor patterns 124 may extend in the first direction. In the drawings, the semiconductor patterns 124 are shown in three levels, respectively, however, inventive concepts may not be limited thereto, and the number of levels may be more than three, or less than three. In the drawings, only two semiconductor patterns 124 are shown at each level on the active pattern 105 extending in the first direction to be spaced apart from each other in the first direction, however, inventive concepts may not be limited thereto, and more than two semiconductor patterns 124 may be spaced apart from each other in the first direction at each level on the active pattern 105.

In some example embodiments, the semiconductor pattern 124 may include nano-sheets and/or nano-wires including a semiconductor material, e.g., at least one of silicon, germanium, etc. In some example embodiments, the semiconductor pattern 124 may serve as a channel of a transistor, and thus may be referred to as the channel.

The gate structure 330 may be formed on the substrate 100, and may surround a central portion in the first direction of each of the semiconductor patterns 124. Thus, the gate structure 330 may cover lower and upper surfaces and opposite sidewalls in the second direction of the central portion of each of the semiconductor patterns 124. In the drawings, the gate structure 330 covers the semiconductor patterns 124 on two active patterns 105, however, inventive concepts may not be limited thereto. For example, the gate structure 330 may extend in the second direction on the substrate 100 having the isolation pattern 130 thereon, and may cover the semiconductor patterns 124 on more than two active patterns 105 spaced apart from each other in the second direction.

In the drawings, two gate structures 330 are shown on the substrate 100, however, inventive concepts may not be limited thereto, and more than two gate structures 330 may be spaced apart from each other in the first direction.

The gate structure 330 may include an interface pattern 290, a gate insulation pattern 300, a workfunction control pattern 310, and/or a gate electrode 320 sequentially stacked on a surface of and/or surrounding each of the semiconductor patterns 124, and/or an upper surface of the active pattern 105.

The interface pattern 290 may be formed on the upper surface of the active pattern 105 and the surface of each of the semiconductor patterns 124, the gate insulation pattern 300 may be formed on a surface of the interface pattern 290 and an inner sidewall of the gate spacer 185, the workfunction control pattern 310 may be formed on the gate insulation pattern 300, and the gate electrode 320 may be formed in spaces between the semiconductor patterns 124, a space between the upper surface of the active pattern 105 and a lowermost one of the semiconductor patterns 124, and a space between the gate spacers 185 neighboring in the first direction on an uppermost one of the semiconductor patterns 124.

The interface pattern 290 may include an oxide, e.g., silicon oxide, and the gate insulation pattern 300 may include a metal oxide having a high dielectric constant, e.g., at least one of hafnium oxide, tantalum oxide, zirconium oxide, etc. The workfunction control pattern 310 may include, e.g., at least one of titanium nitride, tantalum nitride, tungsten nitride, aluminum oxide, etc. The gate electrode 320 may include at least one of a metal, e.g., titanium, aluminum, etc., an alloy of the metal, or a nitride or carbide of the metal.

The gate spacer 185 may cover sidewalls of an upper portion of the gate structure 330 on the uppermost one of the semiconductor patterns 124. The sidewalls may be opposite in the first direction.

The source/drain layer 220 may be formed on the active pattern 105, may be formed between the gate structures 330 that neighbor each other in the first direction, and may commonly contact each of opposite sidewalls in the first direction of the semiconductor patterns 124 to be connected thereto.

In some example embodiments, the source/drain layer 220 may include first and second epitaxial layers 200 and 210. The first epitaxial layer 200 may cover at least a lower surface and opposite sidewalls in the first direction of the second epitaxial layer 210. An upper surface of the second epitaxial layer 210 may protrude from an upper surface of the first epitaxial layer 200 in the third direction, and an uppermost surface of the second epitaxial layer 210 may be higher than an uppermost surface of the first epitaxial layer 200.

In some example embodiments, each of the first and second epitaxial layers 200 and 210 may include single crystalline silicon-germanium including, e.g. doped with p-type impurities. The first and second epitaxial layers 200 and 210 may have first and second impurity concentrations, respectively, and the second impurity concentration may be greater than the first impurity concentration. The second impurity concentration may be greater than or equal to about ten times the first concentration, more particularly, about 40 times the first concentration. A germanium concentration of the second epitaxial layer 210 may be also greater than a germanium concentration of the first epitaxial layer 200.

A third epitaxial layer (not shown) may be further formed on an upper surface of the source/drain layer 220, and may include undoped silicon and/or very lightly doped silicon.

As the source/drain layer 220 includes p-type impurities such as boron, the gate structure 330, the source/drain layer 220 and each of the semiconductor patterns 124 serving as the channel may form a PMOS transistor. A plurality of semiconductor patterns 124 may be spaced apart from each other in the third direction. The plurality of semiconductor patterns 124 may be surrounded by the gate structure 330, and thus the semiconductor device including the gate structure 330 and the semiconductor patterns 124 may be and/or correspond to a multi-bridge channel field effect transistor (MBCFET).

Alternatively or additionally, each of the first and second epitaxial layers 200 and 210 may include single crystalline silicon having, e.g. doped with, n-type impurities such as phosphorus and/or arsenic. The first and second epitaxial layers 200 and 210 may have third and fourth impurity concentrations, respectively, and the fourth impurity concentration may be greater than the third impurity concentration. The fourth impurity concentration may be greater than or equal to about twice the third concentration, more particularly, about 3.5 times the third concentration.

As the source/drain layer 220 includes n-type impurities, the gate structure 330, the source/drain layer 220 and each of the semiconductor patterns 124 serving as the channel may form an NMOS transistor.

In some example embodiments, the source/drain layer 220 may extend in the third direction, but a central portion in the third direction of the source/drain layer 220 may have a convex surface in the first direction. Thus, the source/drain layer 220 may have an enlarged volume, and may supply more current and/or induce more stress to the channel.

The first insulating interlayer 230 may surround a sidewall of the gate spacer 185, and cover the source/drain layer 220. The second insulating interlayer 340 may be formed on the first insulating interlayer 230. The first and second insulating interlayers 230 and 340 may include an oxide, e.g., silicon oxide.

The contact plug 360 may extend through the first and second insulating interlayers 230 and 340 to contact the source/drain layer 220, and a metal silicide pattern 350 may be formed between the contact plug 360 and the source/drain layer 220. The contact plug 360 may contact an upper surface of the source/drain layer 220, and/or extend through an upper portion of the source/drain layer 220 to be in contact therewith. The contact plug 360 may include a metal and/or a metal nitride, and the metal silicide pattern 350 may include, e.g., at least one of cobalt silicide, nickel silicide, titanium silicide, etc.

In some example embodiments, the gate structure 330 may include a lower portion and an upper portion under and over, respectively, the uppermost one of the semiconductor patterns 124. Each of opposite sidewalls in the first direction of a portion of the lower portion of the gate structure 300 between ones of the semiconductor patterns 124 that neighbor each other in the third direction may protrude in the first direction from a corresponding one of opposite sidewalls in the first direction of each of the ones of the semiconductor patterns 124 that neighbor each other in the third direction, and may extend through a portion of the first epitaxial layer 200 of the source/drain layer 220.

For example, a length in the first direction of the portion of the gate structure 330 between the ones of the semiconductor patterns 124 neighboring each other in the third direction may be greater than a length in the first direction of each of the ones of the semiconductor patterns 124 neighboring in the third direction. As the length in the first direction of the lower portion of the gate structure 330 contacting the source/drain layer 220 increases, the leakage current may be reduced, and/or the control of the gate structure 330 on the channel may increase.

However, each of opposite sidewalls in the first direction of the portion of the gate structure 330 between the ones of the semiconductor patterns 124 neighboring each other in the third direction may not extend to the second epitaxial layer 210, and may not be in contact therewith. Accordingly, the second epitaxial layer 210 having a relatively high impurity concentration and/or a relatively high germanium concentration to support more current and/or induce more stress to the channel in the source/drain layer 220 may not be influenced by the extension of the length of the gate structure 330.

In some example embodiments, a length in the first direction of the upper portion of the gate structure 330 may be less than or equal to a length in the first direction of the lower portion of the gate structure 330. In some example embodiments, at least one of the portions of the lower portion of the gate structure 330 between the ones of the semiconductor patterns 124 neighboring in the third direc-tion may protrude in the first direction from an outer sidewall of the gate spacer 185 covering a sidewall of the upper portion of the gate structure 330. In some example embodiments, a maximum/maximal length in the first direction of the lower portion of the gate structure 330 may be greater than a maximum/maximal length in the first direction of the semiconductor patterns 124.

In some example embodiments, the lengths in the first direction of the portions of the gate structure 330 that are between the ones of the semiconductor patterns 124 that neighbor each other in the third direction may not be constant but may vary along the third direction. For example, if the semiconductor patterns 124 sequentially stacked from the upper surface of the active pattern 105 in the third direction are referred to as first, second and third channels, respectively, lengths in the first direction of a portion of the gate structure 330 between the upper surface of the active pattern 105 and the first channel and of a portion of the gate structure 330 between the second and third channels may be greater than a length in the first direction of a portion of the gate structure 330 between the first and second channels.

FIGS. 4 to 16 are plan views and cross-sectional views illustrating a method of manufacturing a semiconductor device in accordance with some example embodiments. Particularly, FIGS. 4, 6, 9 and 15 are the plan views, and FIGS. 5, 7-8, 10-14 and 16 are the cross-sectional views.

Figure 5:
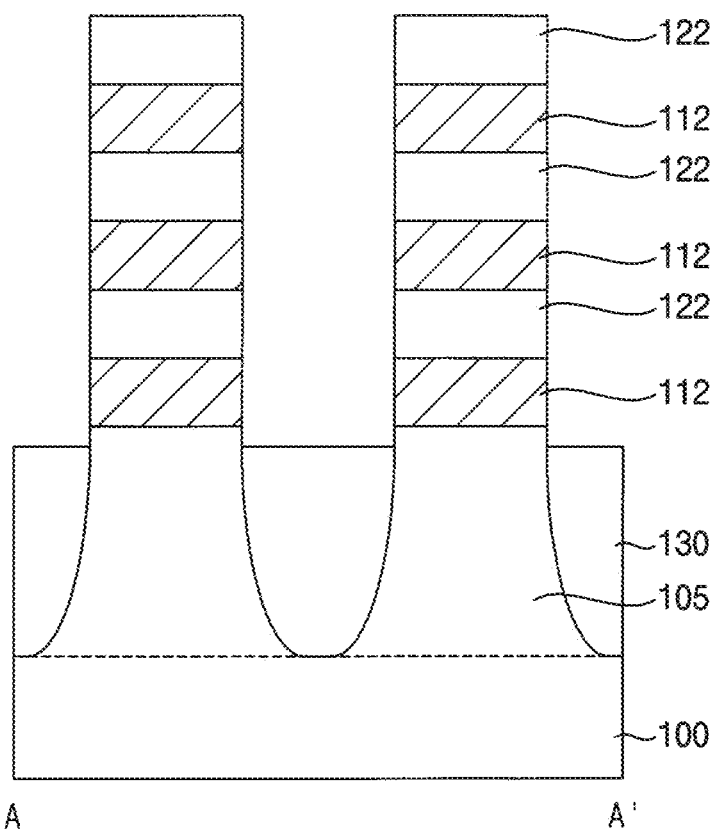

FIGS. 5 and 7 are cross-sectional views taken along lines A-A' of corresponding plan views, respectively, and FIGS. 8, 10-14 and 16 are cross-sectional views taken along lines B-B' of corresponding plan views, respectively.

Figure 4:
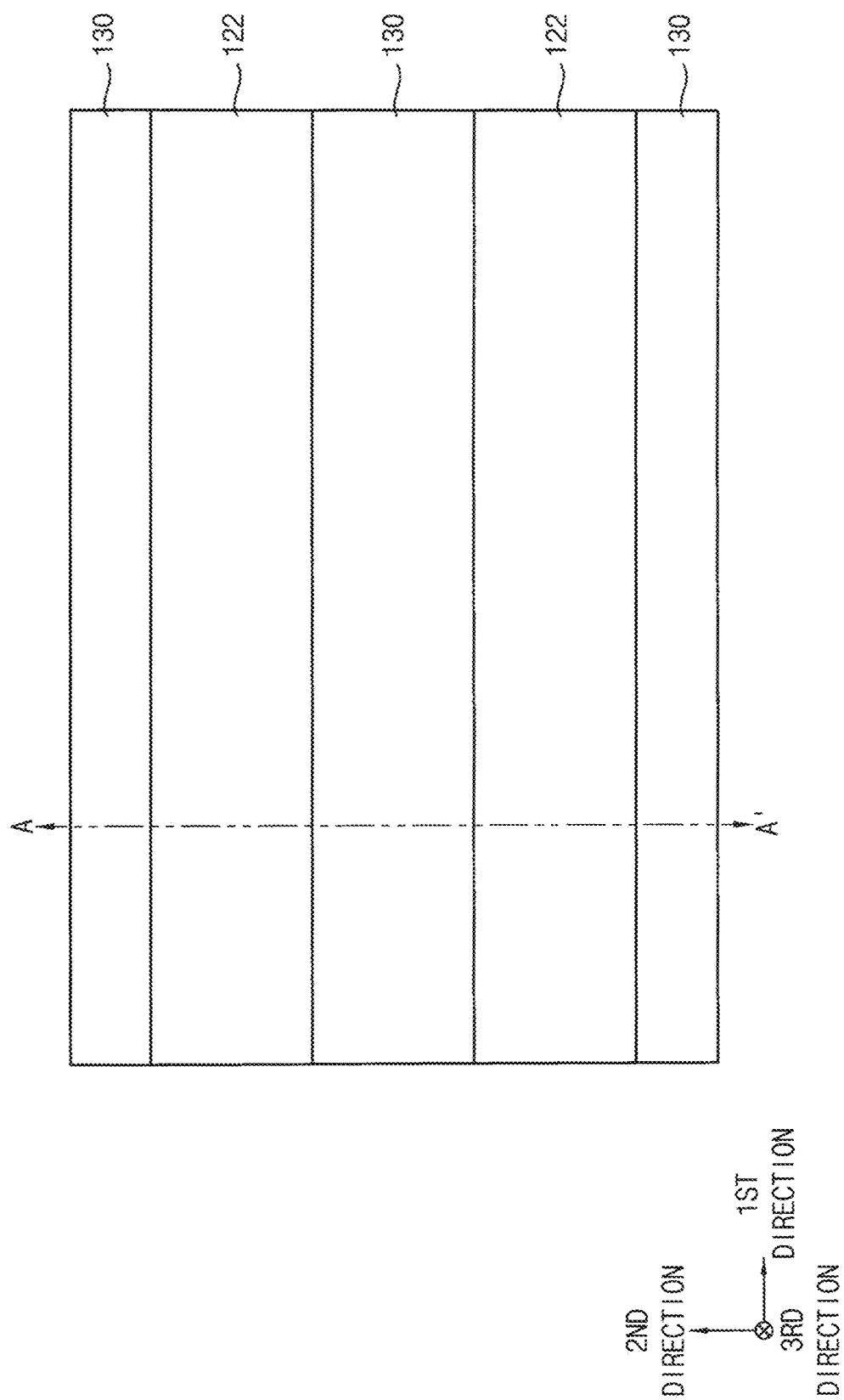

Referring to FIGS. 4 and 5, a sacrificial layer and a semiconductor layer may be alternately and repeatedly formed on a substrate 100, an etching mask extending in the first direction may be formed on an uppermost one of the semiconductor layers or an uppermost one of the sacrificial layers, and the semiconductor layers, the sacrificial layers and an upper portion of the substrate 100 may be etched by using the etching mask.

Thus, an active pattern 105 may be formed on the substrate 100 to extend in the first direction, and a fin structure including sacrificial lines 112 and semiconductor lines 122 that are alternately and repeatedly stacked in the third direction may be formed on the active pattern 105. In some example embodiments, a plurality of fin structures may be spaced apart from each other in the second direction on the substrate 100.

In the drawings, the sacrificial lines 112 and the semiconductor lines 122 are formed at three levels, respectively, however, inventive concepts may not be limited thereto. The sacrificial lines 112 may include a material having an etching selectivity with respect to the semiconductor lines 122 including silicon, and thus the sacrificial lines 112 may include silicon-germanium.

An isolation pattern 130 may be formed on the substrate 100 to cover a sidewall of the active pattern 105. The isolation pattern 130 may be formed with a chemical vapor deposition (CVD) process, and may include an oxide and/or a nitride.

Figure 6:
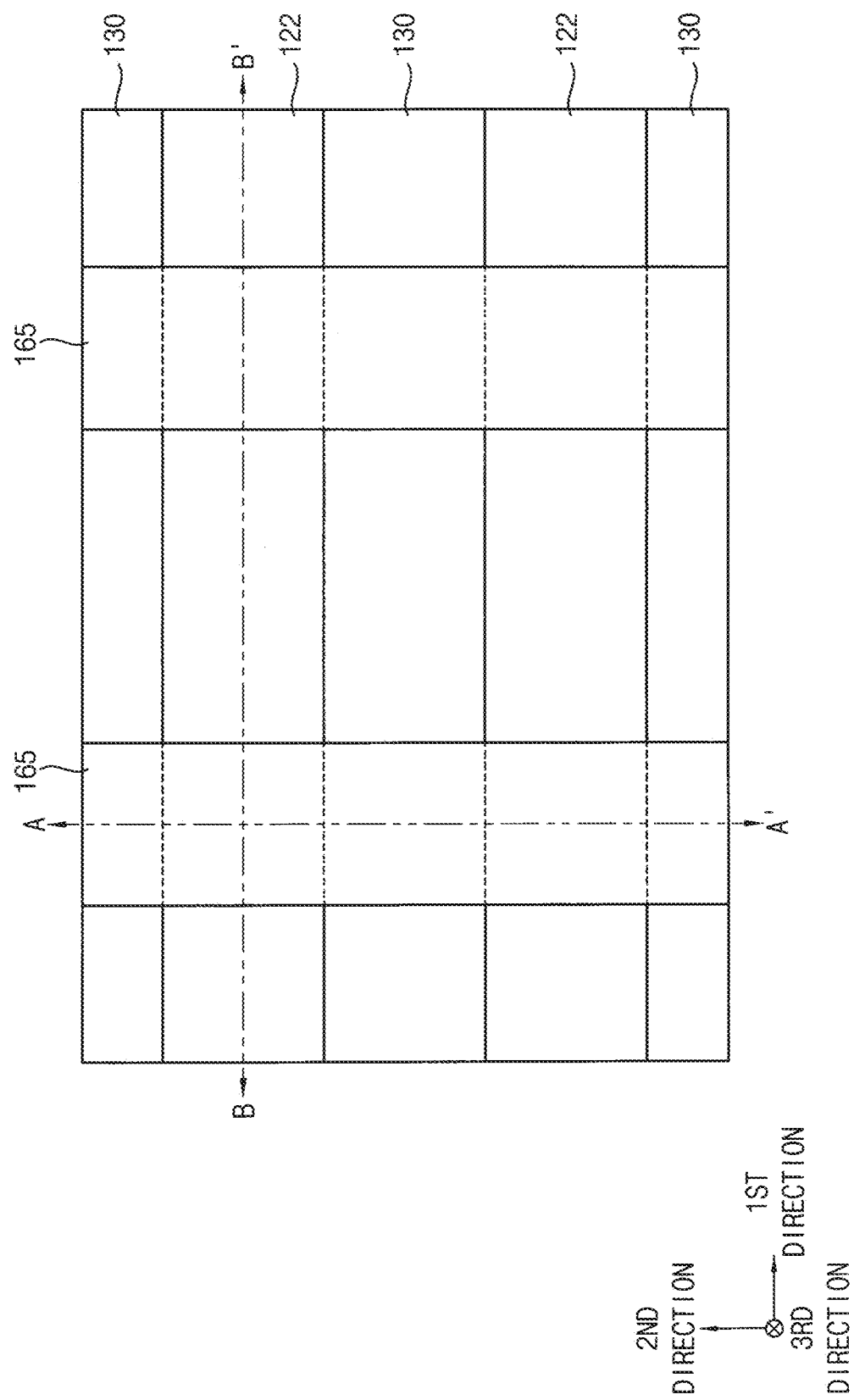
Figure 8:
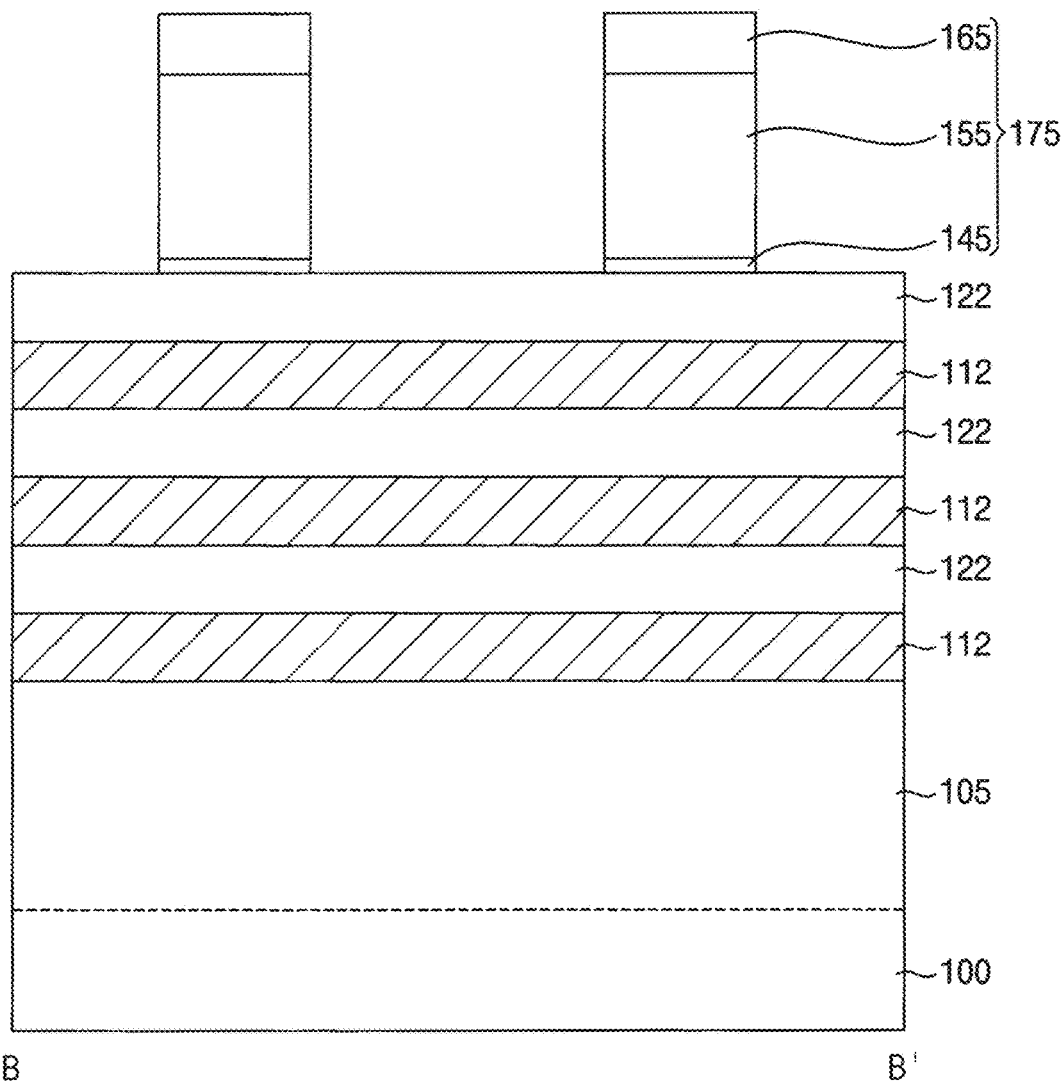

Referring to FIGS. 6 to 8, a dummy gate structure 175 may be formed on the substrate 100 to partially cover the isolation pattern 130 and the fin structure.

Particularly, a dummy gate insulation layer, a dummy gate electrode layer, and a dummy gate mask layer may be formed sequentially on the substrate 100 having the isolation pattern 130 and the fin structure thereon, an etching mask may be formed on the dummy gate mask layer to extend in the second direction, and the dummy gate mask layer may be etched using the etching mask to form a dummy gate mask 165 on the substrate 100.

The dummy gate insulation layer may include an oxide, e.g., silicon oxide; the dummy gate electrode layer may include, e.g., polysilicon; and the dummy gate mask layer may include a nitride, e.g., silicon nitride.

The dummy gate electrode layer and the dummy gate insulation layer may be etched using the dummy gate mask 165 as an etching mask to form a dummy gate electrode 155 and a dummy gate insulation pattern 145, respectively.

The dummy gate insulation pattern 145, the dummy gate electrode 155 and the dummy gate mask 165 that are sequentially stacked on the active pattern 105 and a portion of the isolation pattern 130 adjacent thereto may form a dummy gate structure 175. In some example embodiments, the dummy gate structure 175 may extend in the second direction on the fin structure and the isolation pattern 130, and may cover an upper surface and opposite sidewalls in the second direction of the fin structure.

Figure 9:
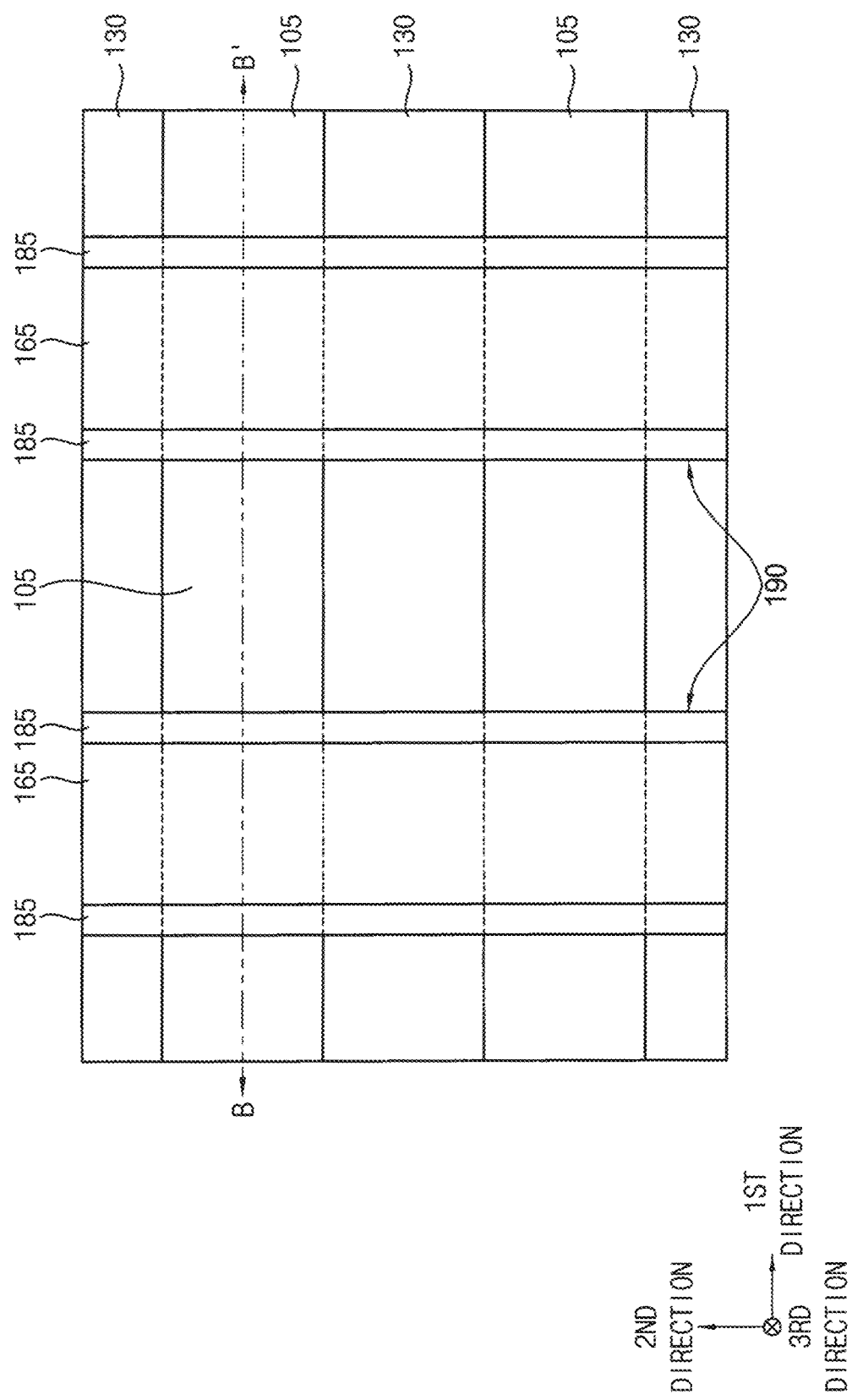
Figure 10:
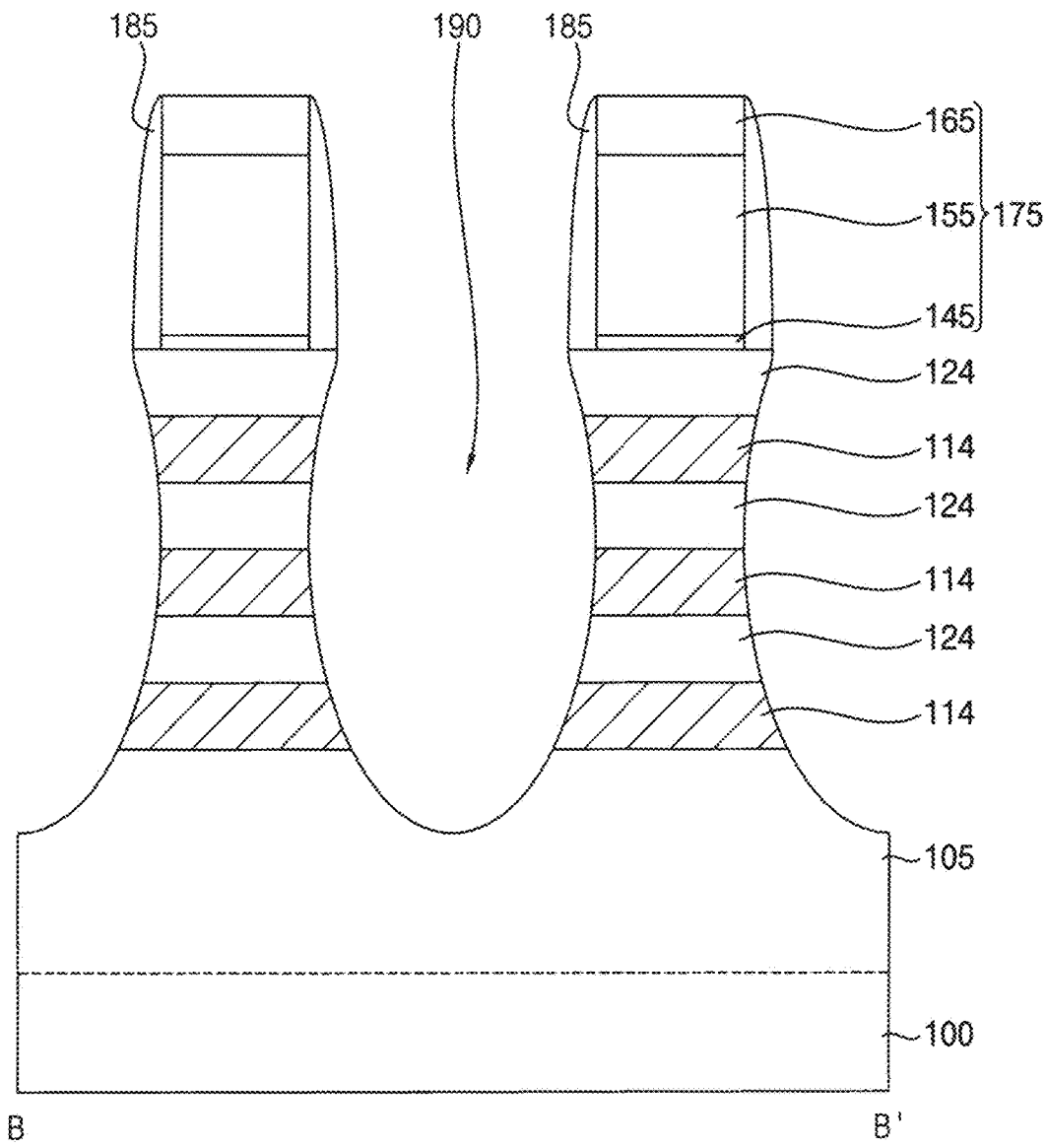

Referring to FIGS. 9 and 10, a gate spacer 185 may be formed on a sidewall of the dummy gate structure 175.

Particularly, a first spacer layer may be formed on the substrate 100 having the fin structure, the isolation pattern 130, and the dummy gate structure 175, and may be anisotropically etched to form the gate spacer 185 covering opposite sidewalls in the first direction of the dummy gate structure 175.

The fin structure and an upper portion of the active pattern 105 thereunder may be etched, e.g., may be isotropically etched with a wet chemical process and/or may be etched with a dry etching process. The fin structure and the upper portion of the active pattern 105 may be etched using the dummy gate structure 175 and the gate spacer 185 as an etching mask to form a first opening 190.

Thus, the sacrificial lines 112 and the semiconductor lines 122 under the dummy gate structure 175 and the gate spacer 185 may be transformed into sacrificial patterns 114 and semiconductor patterns 124, respectively, and the fin structure extending in the first direction may be divided into a plurality of pieces spaced apart from each other in the first direction.

Hereinafter, the dummy gate structure 175, the gate spacers 185 on opposite sidewalls, respectively, of the dummy gate structure 175, and the fin structure thereunder may be referred to as a first structure. In some example embodiments, the first structure may extend in the second direction, and a plurality of first structures may be spaced apart from each other in the first direction.

In some example embodiments, the first opening 190 that may be formed by the etching process may have a large volume. Thus, a sidewall in the first direction of the first opening 190 may have a convex shape. Sidewalls in the first direction of the semiconductor patterns 124 may have a slope that may not be perpendicular, but may be slanted with respect to an upper surface of the substrate 100. Thus, lengths in the first direction of the semiconductor patterns 124 may not be constant along the third direction.

Figure 11:
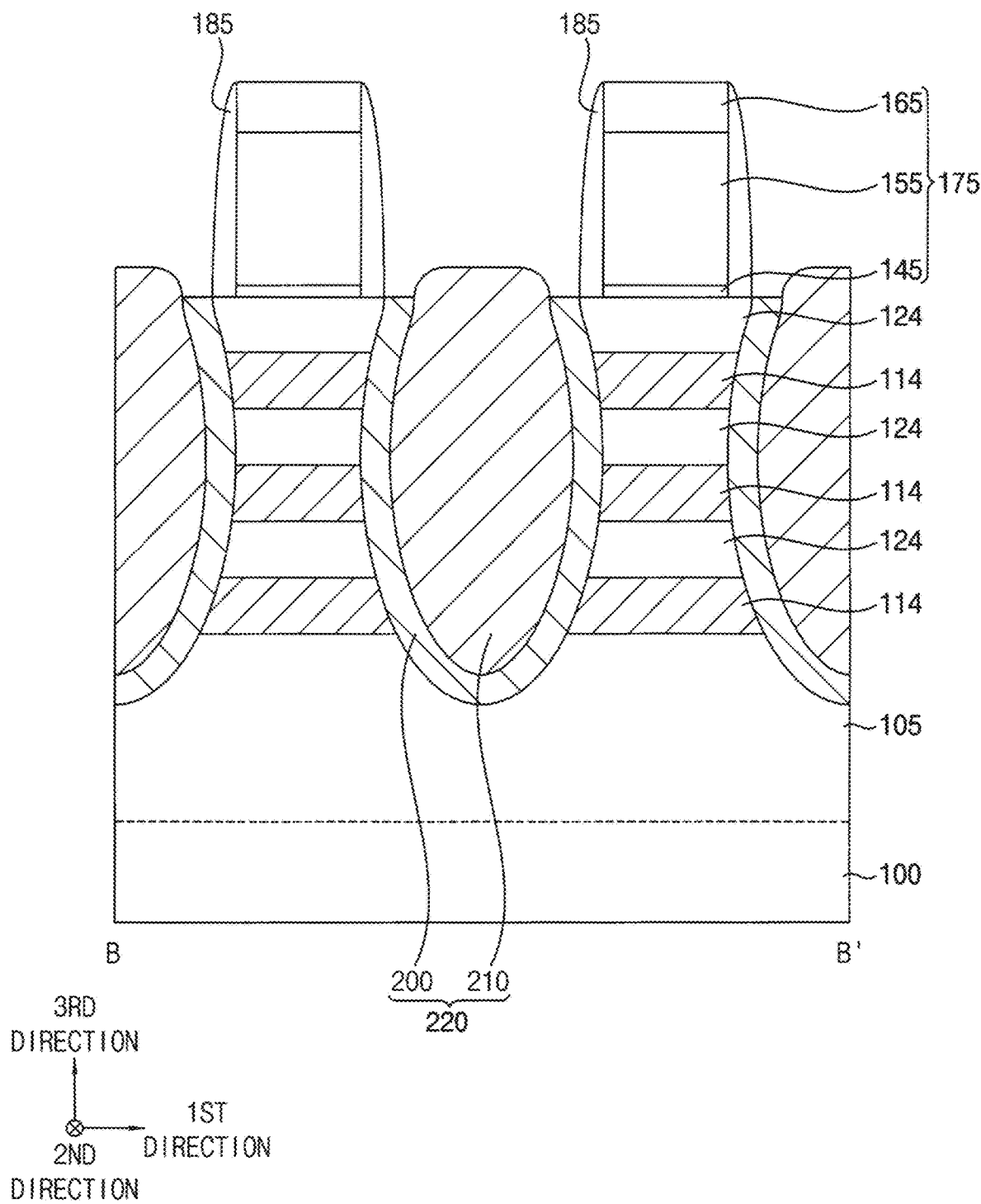

Referring to FIG. 11, a first selective epitaxial growth (SEG) process may be performed using sidewalls of the semiconductor patterns 124, along with the sacrificial patterns 114 and an upper surface of the active pattern 105 exposed by the first opening 190 as a seed, e.g. as seeding layers, to form a first epitaxial layer 200 in an inner wall of the first opening 190.

In some example embodiments, the first SEG process may be performed using a silicon source gas, e.g., dichlorosilane ($SiH_2CL_2$), a germanium source gas, e.g., $GeH_4$, and a p-type impurity source gas, e.g., diborane ($B_2H_6$), so that a single crystalline silicon-germanium layer having or doped with p-type impurities may be formed. The first epitaxial layer 200 may have a first impurity concentration. Alternatively or additionally the first epitaxial layer 200 may be implanted with a p-type impurity.

A second SEG process may be performed using the silicon source gas, the germanium source gas and the p-type impurity source gas to form a second epitaxial layer 210 filling a remaining portion of the first opening 190. The second epitaxial layer 210 may be a single crystalline silicon-germanium layer having or doped with p-type impurities. Alternatively or additionally the second epitaxial layer 210 may be implanted with a p-type impurity. The second epitaxial layer 210 may have a second impurity concentration greater than the first impurity concentration. A germanium concentration of the second epitaxial layer 210 may be greater than a germanium concentration of the first epitaxial layer 200.

In some example embodiments, an uppermost surface of the second epitaxial layer 210 may be higher than an uppermost surface of the first epitaxial layer 200.

The first and second epitaxial layers 200 and 210 may form or correspond to a source/drain layer 220. A third SEG process may be optionally performed using only the silicon source gas to form a third epitaxial layer (not shown). The third epitaxial layer may be thinly formed on an upper surface of the source/drain layer 220, which may be referred to as a capping layer.

Up to now, the source/drain layer 220 including p-type impurities has been formed, however, inventive concepts may not be limited thereto, and the source/drain layer 220 may include n-type impurities. The source/drain layer 220 may also include other impurities, such as but not limited to carbon.

Particularly, a fourth SEG process may be performed using a silicon source gas, e.g., disilane ($Si_2H_6$) and an n-type impurity source gas, e.g., $PH_3$, $POCl_3$, $P_2O_5$, etc., so that a single crystalline silicon layer having, e.g. doped with n-type impurities may be formed as the first epitaxial layer 200. Alternatively or additionally, the first epitaxial layer may be implanted with an n-type impurity such as phosphorus and/or arsenic. The first epitaxial layer 200 may have a third impurity concentration.

A fifth SEG process may be performed using the silicon source gas and the n-type impurity source gas and/or with an implantation of an n-type impurity, so that a single crystalline silicon layer having/doped with n-type impurities may be formed as the second epitaxial layer 210. The second epitaxial layer 210 may have a fourth impurity concentration greater than the third impurity concentration.

Figure 12:
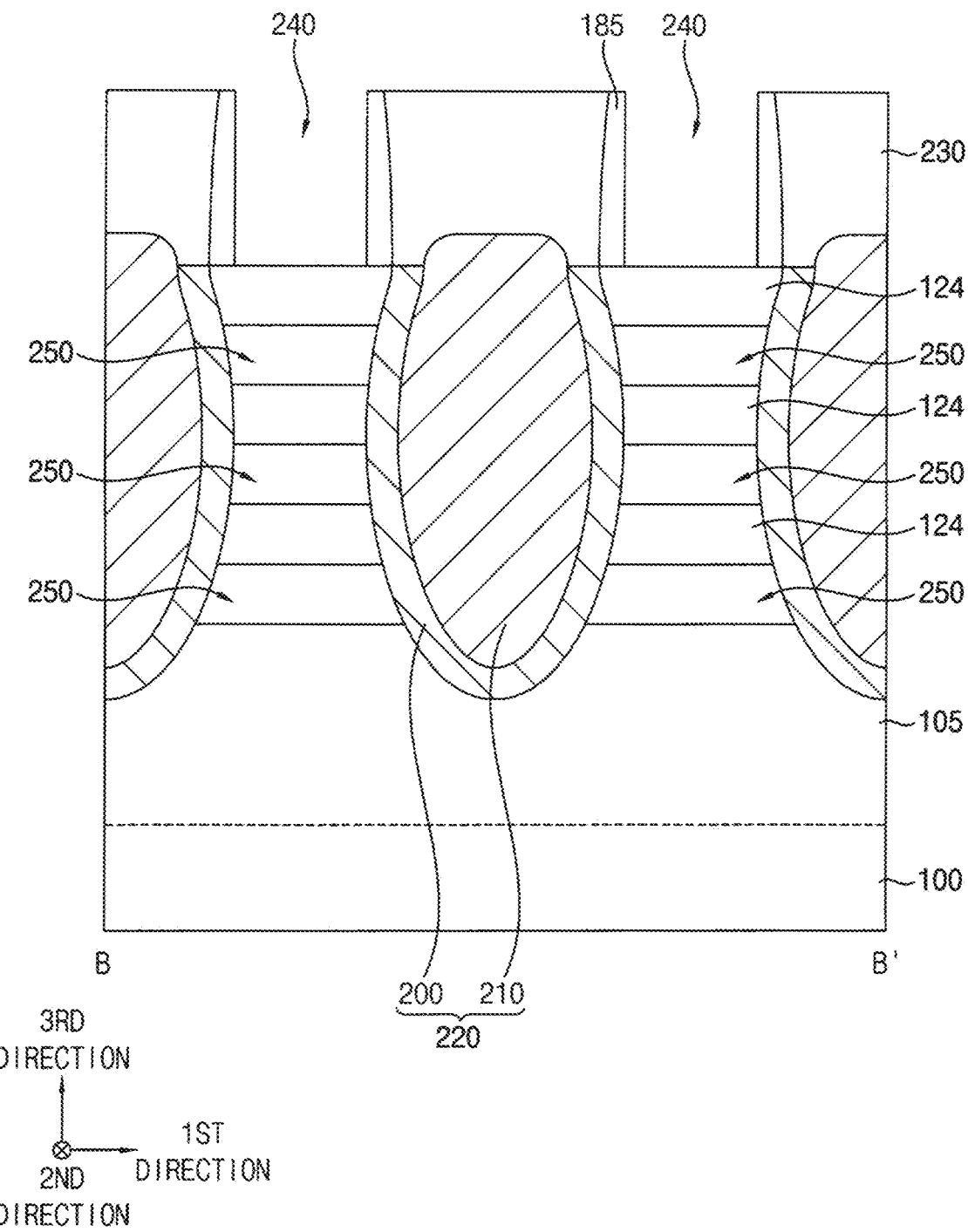

Referring to FIG. 12, a first insulating interlayer 230 may be formed on the substrate 100 to cover the first structure and the source/drain layer 220, and may be planarized until an upper surface of the dummy gate electrode 155 of the first structure is exposed. During the planarization process, the dummy gate mask 165 may be also removed, and an upper portion of the gate spacer 185 may be removed.

The planarization process may be performed by a chemical mechanical polishing (CMP) process and/or an etch back process.

The exposed dummy gate electrode 155, the dummy gate insulation pattern 145 thereunder, and the sacrificial patterns 114 may be removed by, e.g., a wet etching process and/or a dry etching process to form a second opening 240 that exposes an inner sidewall of the gate spacer 185 and an upper surface of the uppermost one of the semiconductor patterns 124. The wet etching process and/or the dry etching process may form a third opening 250 exposing portions of a sidewall of the source/drain layer 220, surfaces of the semiconductor patterns 124 and an upper surface of the active pattern 105.

Figure 13:
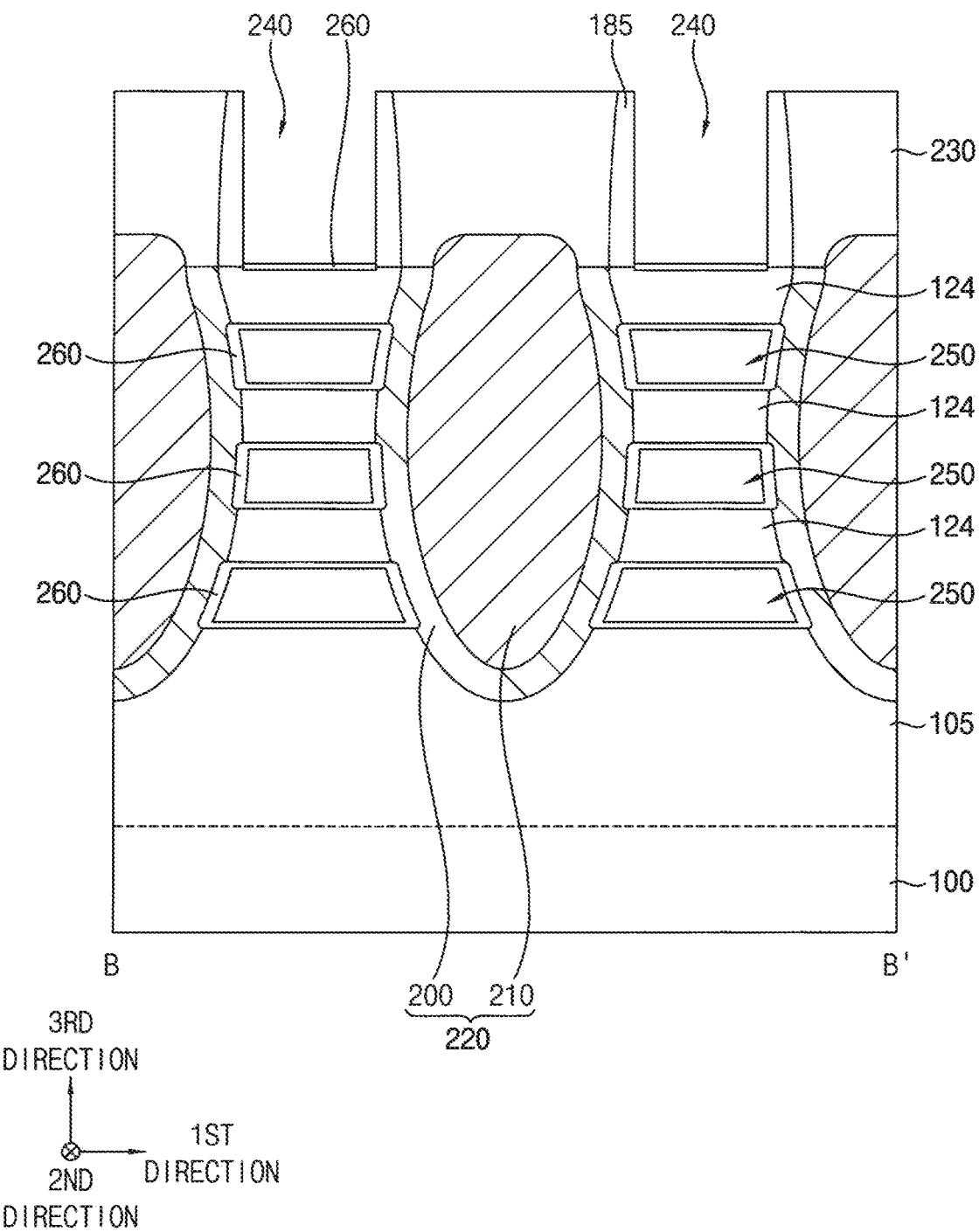

Referring to FIG. 13, an oxidation process, e.g. a thermal oxidation process, may be performed on the surfaces of the semiconductor patterns 124, the upper surface of the active pattern 105, and the portions of the sidewall of the source/drain layer 220 exposed by the second and third openings 240 and 250 to form an oxide layer 260 including silicon oxide and/or germanium oxide.

In some example embodiments, a portion of the oxide layer 260 at the sidewall of the source/drain layer 220 including silicon-germanium and/or a semiconductor material doped with impurities may have a thickness greater than portions of the oxide layer at the surfaces of the semiconductor patterns 124 and the upper surface of the active pattern 105 including silicon.

Figure 14:
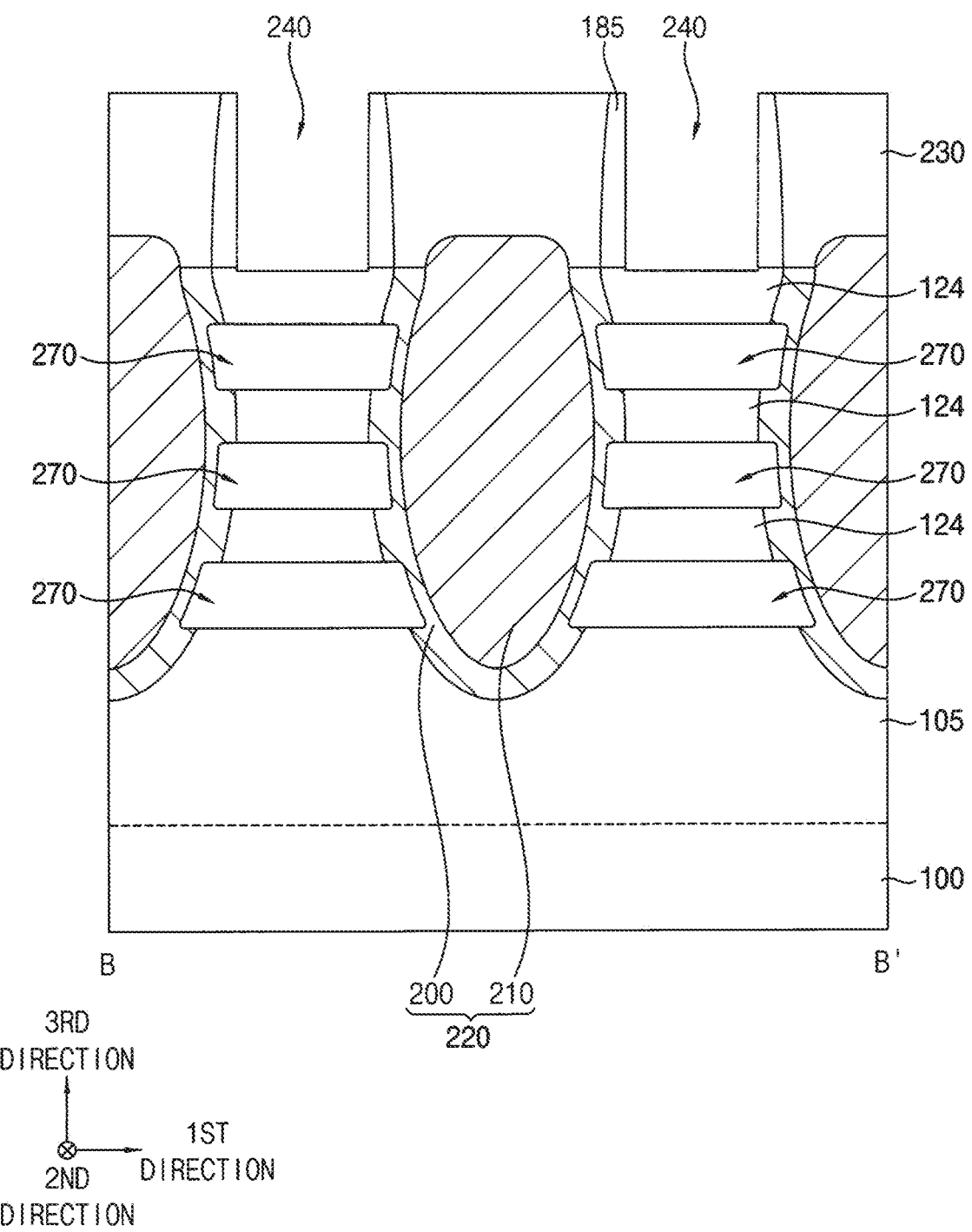

Referring now to FIG. 14, the oxide layer 260 may be removed to enlarge the third opening 250, which may be a fourth opening 270.

In some example embodiments, the oxide layer 260 may be removed by an etching process, such as a wet-etching process, using hydrogen fluoride (HF), e.g. buffered HF (BHF). As the etching process is performed, the oxide layer 260 may be removed, and if reside remains during the removal of the sacrificial patterns 114 including silicon-germanium, the residue may be also removed. Thus, the interface characteristics of the source/drain layer 220 may be enhanced and/or improved.

In some example embodiments, the fourth opening 270 may have a volume that is greater than that of the third opening 250, and particularly, a width in the first direction of the fourth opening 270 may be greater than that of the third opening 250. This is because the thickness of the portion of the oxide layer 260 at the sidewall of the source/drain layer 220 may be greater than the portions of the oxide layer at the surfaces of the semiconductor patterns 124 and the upper surface of the active pattern 105, and/or the sidewall of the source/drain layer 220 including silicon-germanium may be removed more than the surfaces of the semiconductor patterns 124 and the upper surface of the active pattern 105 including silicon.

However, in some example embodiments, the sidewall of the fourth opening 270 may be formed within the first epitaxial layer 200 of the source/drain layer 220, and may not be enlarged to the second epitaxial layer 210.

Figure 15:
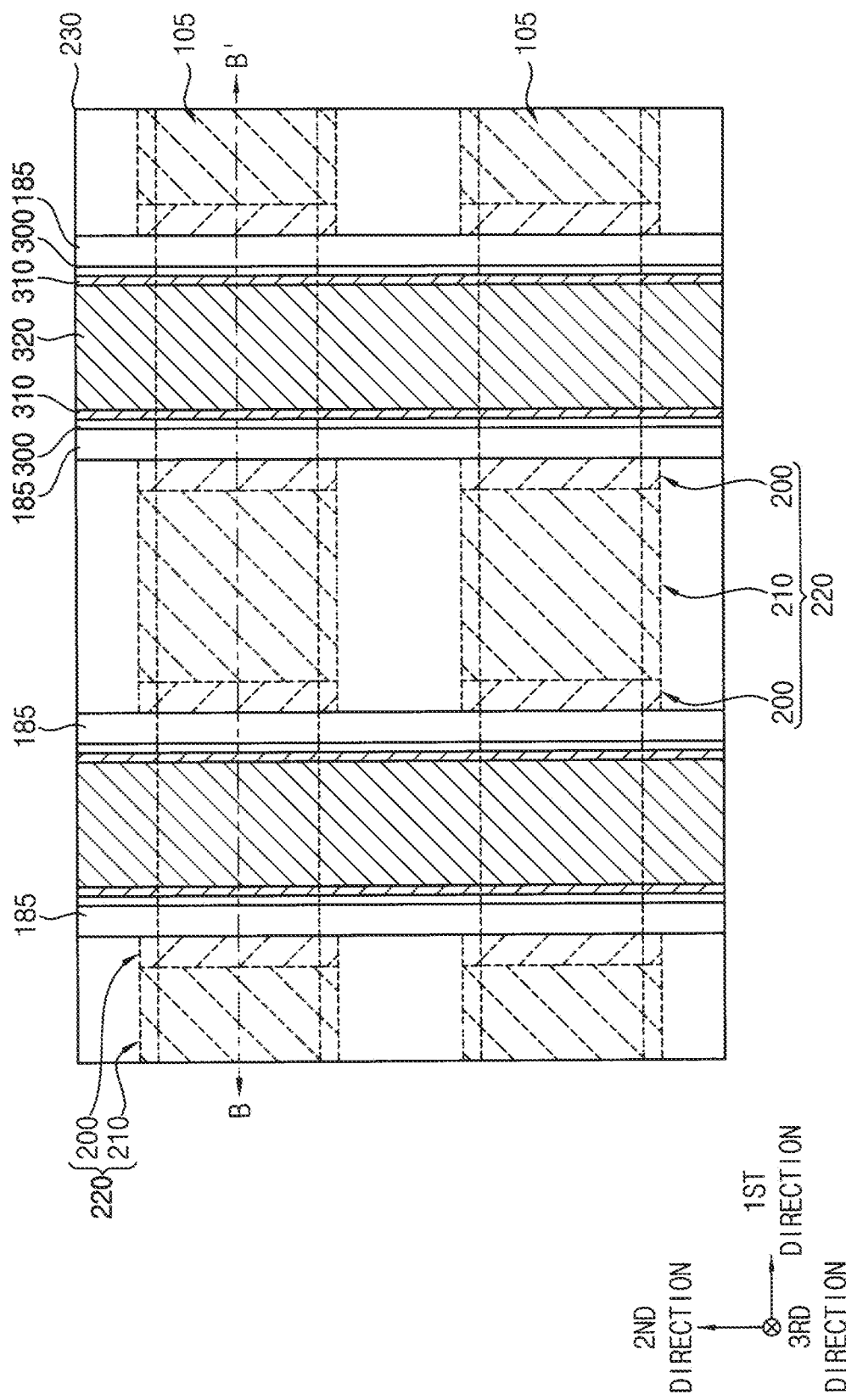
Figure 16:
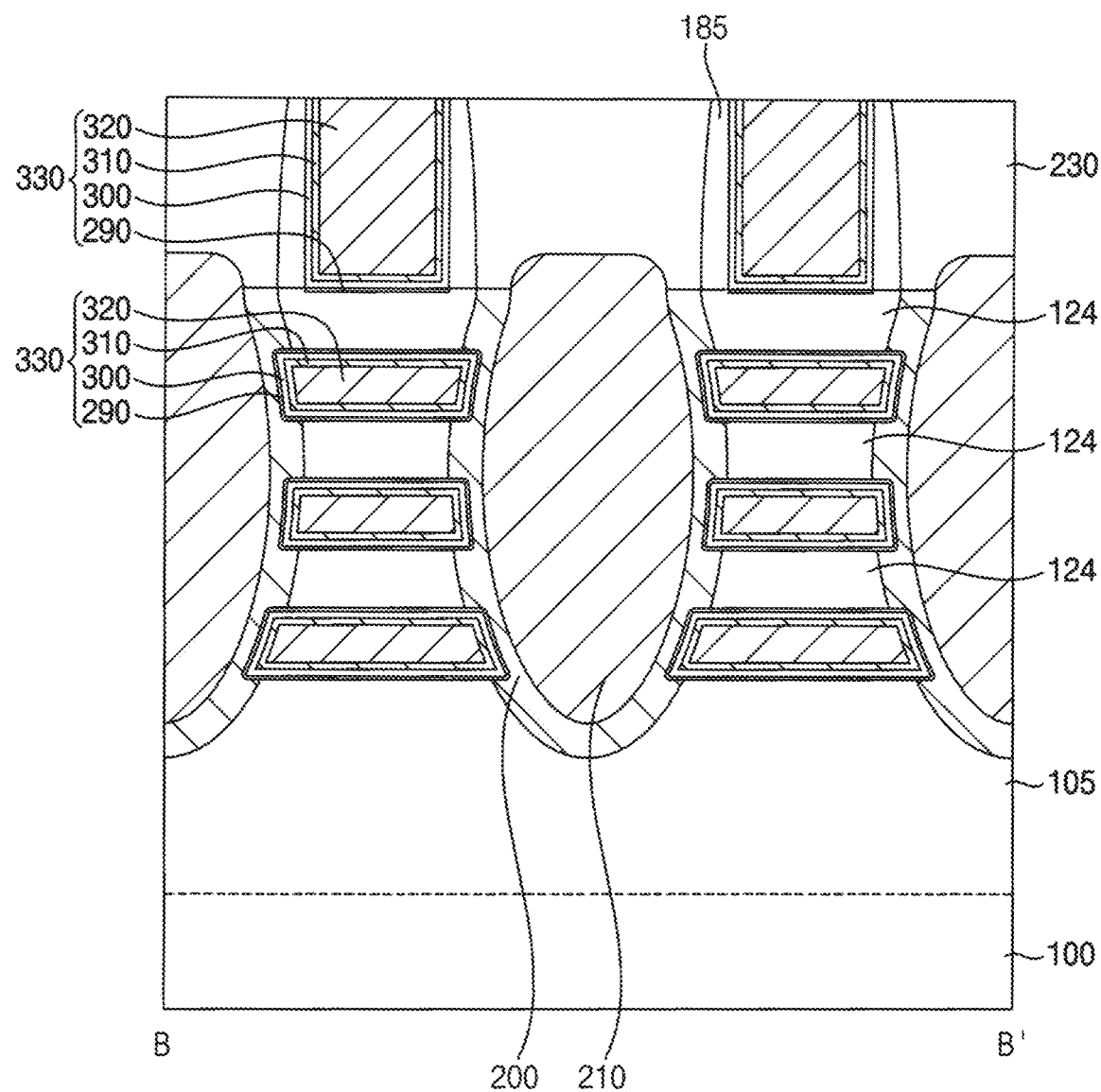

Referring to FIGS. 15 and 16, a gate structure 330 may be formed on the substrate 100 to fill the second and fourth openings 240 and 270.

Particularly, after a thermal oxidation process is performed on the upper surface of the active pattern 105, the surfaces of the semiconductor patterns 124, and the sidewall of the source/drain layer 220 exposed by the second and fourth openings 240 and 270 to form an interface pattern 290, a gate insulation layer and a workfunction control layer may be sequentially formed on a surface of the interface pattern 290, an inner sidewall and an upper surface of the gate spacer 185, and an upper surface of the first insulating interlayer 230. A gate electrode layer may be formed filling remaining portions of the second and fourth openings 240 and 270.

The gate insulation layer, the workfunction control layer, and the gate electrode layer may be formed by, e.g., at least one of a CVD process, an atomic layer deposition (ALD) process, a physical vapor deposition (PVD) process, etc. The interface pattern 290 may be also formed by a CVD process, an ALD process, a PVD process, etc., instead of the thermal oxidation process, and in this case, the interface pattern 290 may be also formed on the inner sidewall and the upper surface of the gate spacer 185 and the upper surface of the first insulating interlayer 230.

The gate electrode layer, the workfunction control layer, and the gate insulation layer may be planarized, e.g. planarized with an etch-back and/or CMP process, until the upper surface of the first insulating interlayer 230 is exposed to form a gate electrode 320, a workfunction control pattern 310, and a gate insulation pattern 300, respectively. The interface pattern 290, the gate insulation pattern 300, the workfunction control pattern 310 and the gate electrode 320 may form the gate structure 330.

Referring to FIGS. 1 to 3 again, a second insulating interlayer 340 may be formed on the gate structure 330, the gate spacer 185, and the first insulating interlayer 230. A hole may be formed through the first and second insulating interlayers 230 and 340 and an upper portion of the source/drain layer 220, and a contact plug 360 may be formed in the hole.

Before forming the contact plug 360, a metal layer may be formed on an inner wall of the hole, and a silicidation process may be performed thereon to form a metal silicide pattern 350 at an upper portion of the source/drain layer 220 exposed by the hole.

In some example embodiments, the contact plug 360 may extend through an upper portion of the source/drain layer 220 to have a bottom at a height at which one of the semiconductor patterns 124 at a second level from above is formed.

By the above processes, the semiconductor device may be fabricated/manufactured.

As illustrated above, after removing the sacrificial patterns 114 to form the third opening 250, the oxide layer 260 may be formed by the oxidation process and removed by the etching process, e.g. wet etching process, so that the fourth opening 270 having the width in the first direction greater than that of the third opening 250 may be formed. Thus, the gate structure 330 filling the fourth opening 270 may have an enlarged length in the first direction. By adjusting the oxidation process for forming the oxide layer 260 and/or the etching process for removing the oxide layer 260, the width in the first direction of the fourth opening 270 may be adjusted, and accordingly, the length in the first direction of the gate structure 330 in the fourth opening 270 may be also adjusted.

During the formation and removal of the oxide layer 260, the residue of the sacrificial patterns 114 not removed during the previous etching process may be additionally removed, which may also enhance the interface characteristics of the source/drain layer 220.

Figure 17:
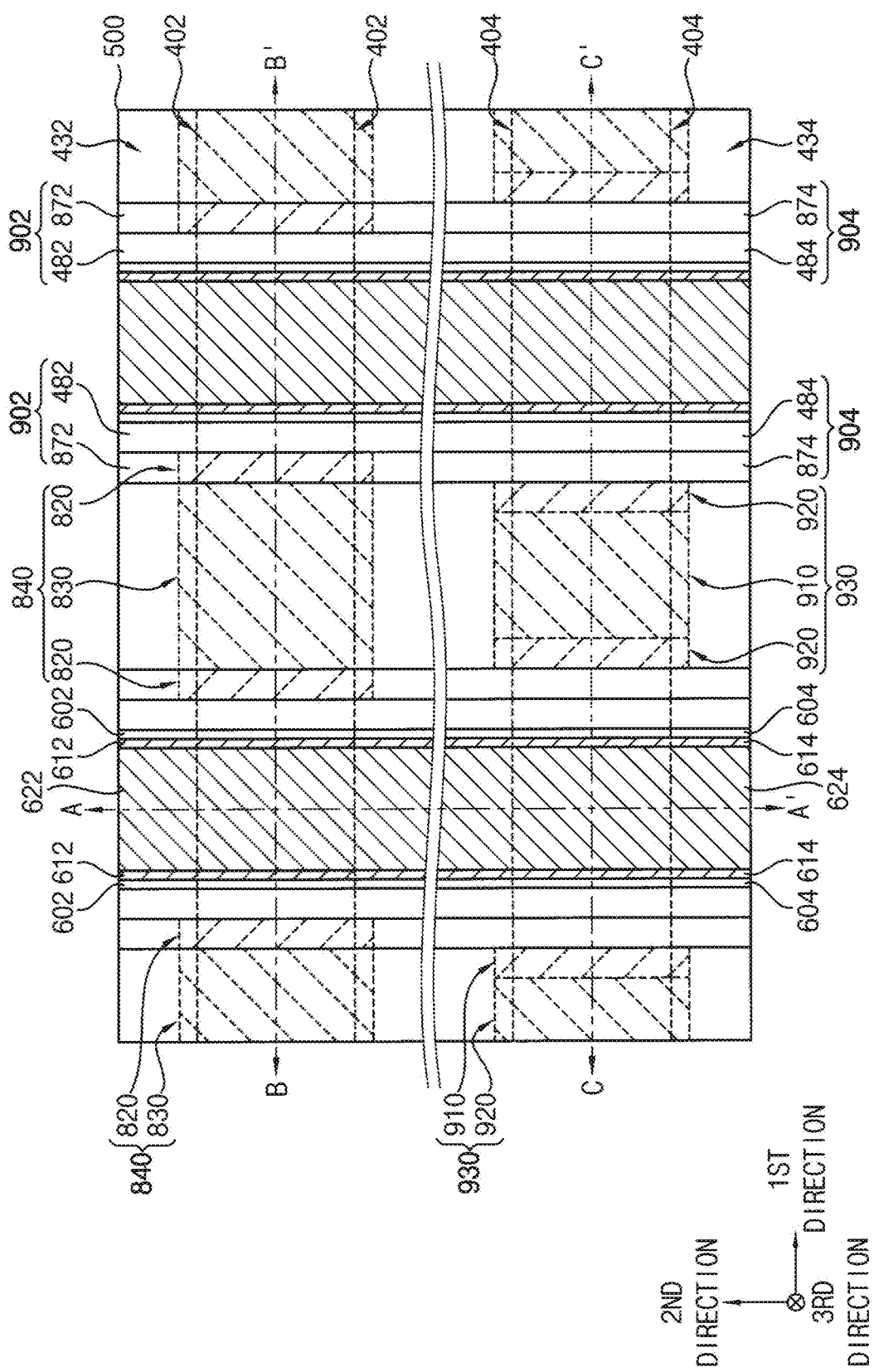
FIGS. 17 to 20 are a plan view and cross-sectional views illustrating a semiconductor device in accordance with some example embodiments.
Figure 18:
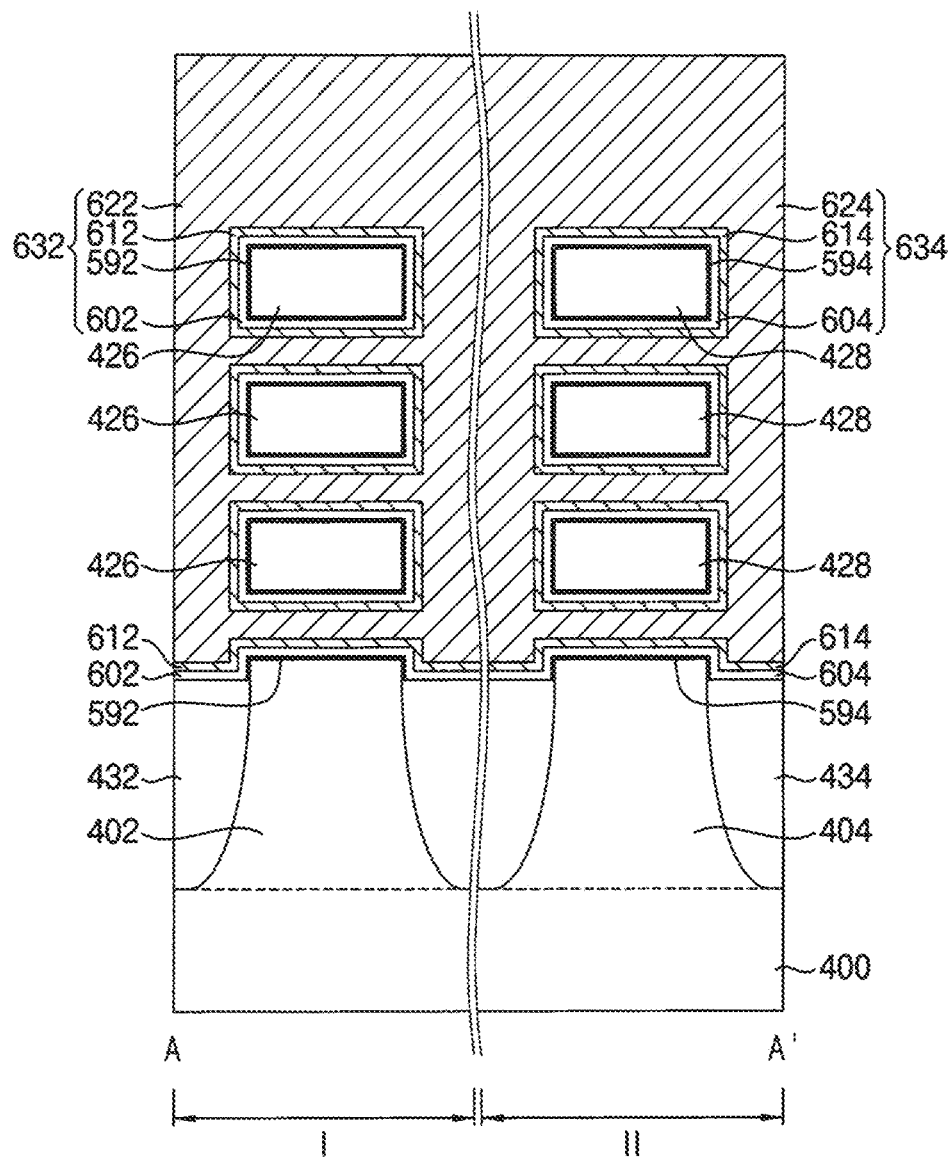
Figure 19:
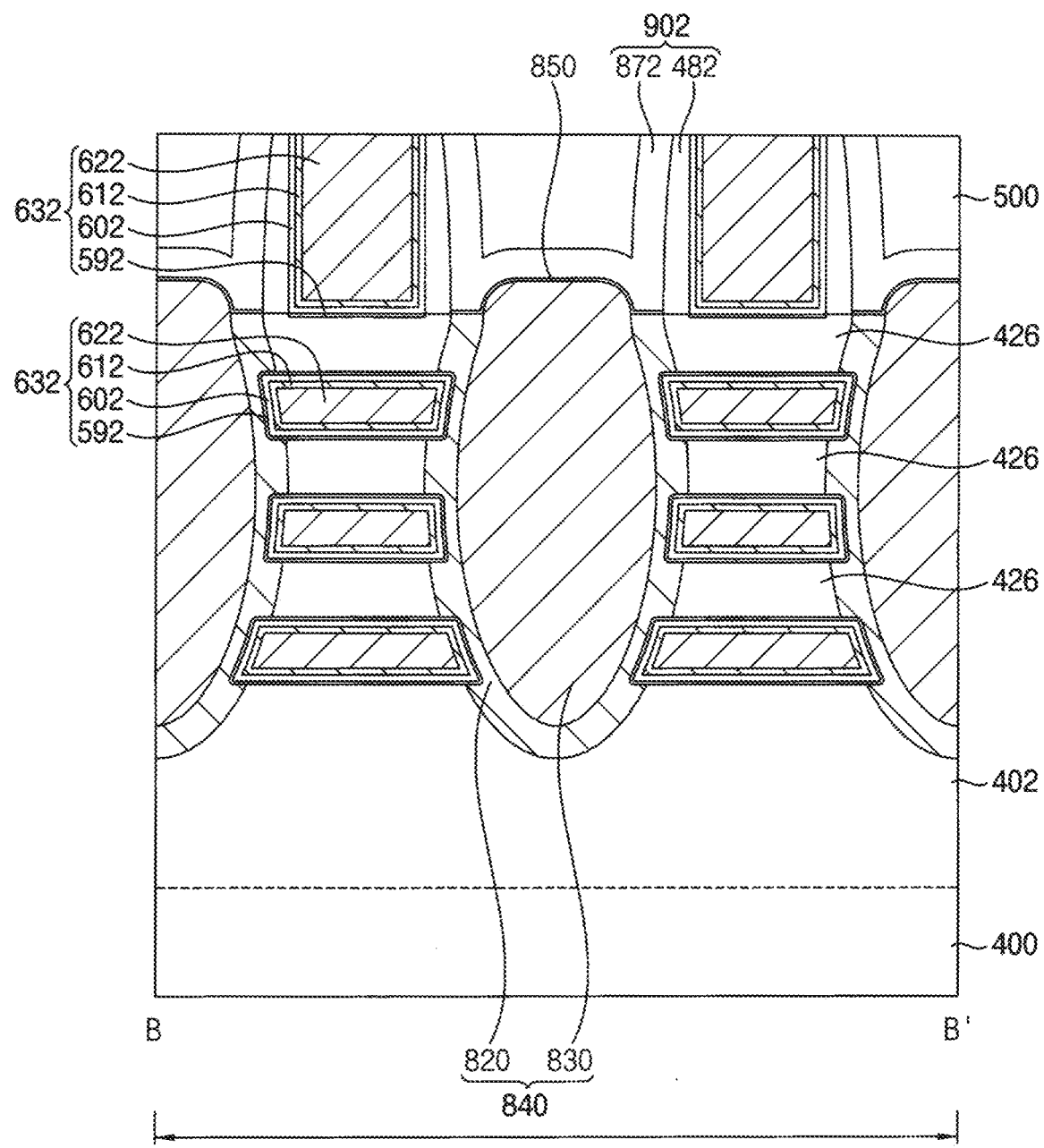
Figure 20:
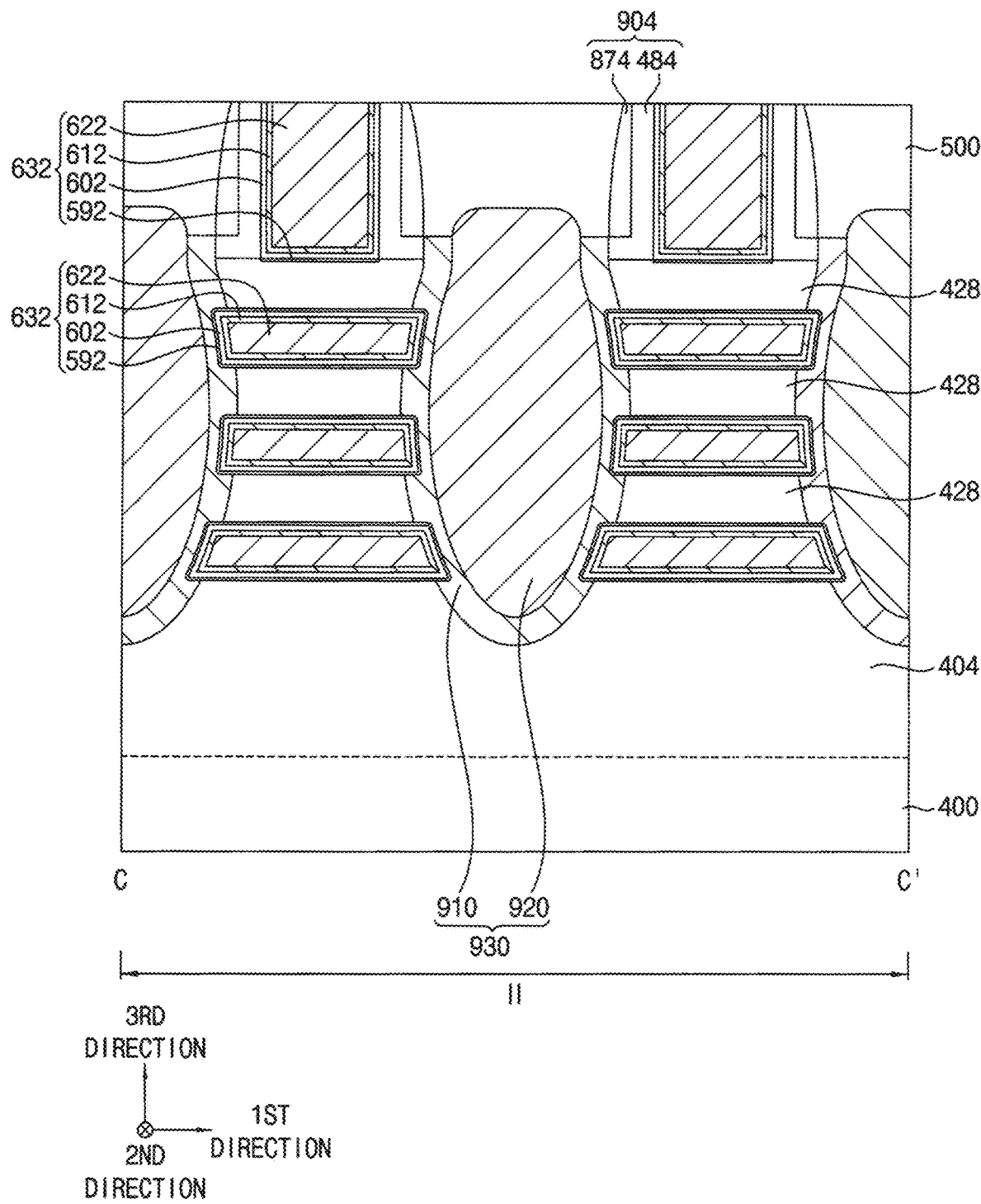

FIGS. 17 to 20 are a plan view and cross-sectional views illustrating a semiconductor device in accordance with some example embodiments. FIG. 17 is the plan view, FIG. 18 is a cross-sectional view taken along a line A-A' of FIG. 17, FIG. 19 is a cross-sectional view taken along a line B-B' of FIG. 17, and FIG. 20 is a cross-sectional view taken along a line C-C' of FIG. 17.

This semiconductor device is an application of inventive concepts illustrated with reference to FIGS. 1 to 3 to a complementary metal oxide semiconductor (CMOS) transistor including a PMOS transistor and an NMOS transistor.

Referring to FIGS. 17 to 20, the semiconductor device may include first and second MBCFETs on first and second regions I and II, respectively, of a substrate 400.

The first and second regions I and II of the substrate 400 may be or include a PMOS region and an NMOS region, respectively, and thus the first MBCFET may include PMOS transistors and the second MBCFET may include NMOS transistors.

The first MBCFET may be formed on a first active pattern 402 on the first region I of the substrate 400, and may include a first gate structure 632, first semiconductor patterns 426, a first source/drain layer 840, and a first gate spacer structure 902.

A sidewall of the first active pattern 402 may be covered by a first isolation pattern 432.

The first semiconductor patterns 426 may be formed at a plurality of levels, respectively, over an upper surface of the first active pattern 402 to be spaced apart from each other in the third direction. Each of the first semiconductor patterns 426 may extend in the first direction, and lower and upper surfaces, along with sidewalls opposite to each other in the second direction of at least a portion of each of the first semiconductor patterns 426 may be surrounded by the first gate structure 632. Each of the first semiconductor patterns 426 may serve as/correspond to a channel of the PMOS transistor, and thus may be referred to as a first channel.

The first gate structure 632 may be formed on the first active pattern 402 and a portion of the first isolation pattern 432 adjacent thereto in the second direction, and may surround each of the first semiconductor patterns 426.

The first gate structure 632 may include a first interface pattern 592, a first gate insulation pattern 602, a first workfunction control pattern 612 and a first gate electrode 622 sequentially stacked on a surface of each of the first semiconductor patterns 426 and/or the upper surface of the first active pattern 402.

The first gate spacer structure 902 may include a first gate spacer 482 covering an upper sidewall of the first gate structure 632 and a second gate spacer 872 on an outer sidewall of the first gate spacer 482. For convenience of explanation, the first gate structure 632, the first gate spacers 482 on opposite sidewalls in the first direction of the first gate structure 632, and the first semiconductor patterns 426 may be referred to as a third structure.

The first source/drain layer 840 may extend in the third direction on an upper surface of the first active pattern 402, and may contact each of opposite sidewalls in the first direction of the first semiconductor patterns 426 to be connected thereto.

The first source/drain layer 840 may include first and second epitaxial layers 820 and 830. In some example embodiments, each of the first and second epitaxial layers 820 and 830 may include single crystalline silicon-germanium having/doped with p-type impurities, and an impurity concentration and a germanium concentration of the second epitaxial layer 830 may be greater than an impurity concentration and a germanium concentration of the first epitaxial layer 820, respectively. A third epitaxial layer 850 including undoped silicon may be further formed on the first source/drain layer 840.

The second MBCFET may be formed on the second active pattern 404 on the second region II of the substrate 400, and may include a second gate structure 634, second semiconductor patterns 428, a second source/drain layer 930, and a second gate spacer structure 904.

A sidewall of the second active pattern 404 may be covered by a second isolation pattern 434.

The second semiconductor patterns 428 may be formed at a plurality of levels, respectively, over an upper surface of the second active pattern 404 to be spaced apart from each other in the third direction. Each of the second semiconductor patterns 428 may extend in the first direction, and lower and upper surfaces and opposite sidewalls in the second direction of at least a portion of each of the second semiconductor patterns 428 may be surrounded by the second gate structure 634. Each of the second semiconductor patterns 428 may serve as/correspond to a channel of the NMOS transistor, and thus may be referred to as a second channel.

The second gate structure 634 may be formed on the second active pattern 404 and a portion of the second isolation pattern 434 adjacent thereto in the second direction, and may surround each of the second semiconductor patterns 428.

The second gate structure 634 may include a second interface pattern 594, a second gate insulation pattern 604, a second workfunction control pattern 614 and a second gate electrode 624 sequentially stacked on a surface of each of the second semiconductor patterns 428 or the upper surface of the second active pattern 404.

The second gate spacer structure 904 may include a third gate spacer 484 covering an upper sidewall of the second gate structure 634 and having a cross-section in the first direction of an "L" shape and a fourth gate spacer 874 on an outer sidewall of the third gate spacer 484.

For the convenience of explanation, the second gate structure 634, the second gate spacer structures 904 on opposite sidewalls in the first direction of the second gate structure 634, and the second semiconductor patterns 428 may be referred to as a fourth structure.

The second source/drain layer 930 may extend in the third direction on an upper surface of the second active pattern 404, and may contact each of opposite sidewalls in the first direction of the second semiconductor patterns 428 to be connected thereto. The second source/drain layer 930 may include fourth and fifth epitaxial layers 910 and 920. In some example embodiments, each of the fourth and fifth epitaxial layers 910 and 920 may include single crystalline silicon or single crystal silicon-germanium having/doped with n-type impurities, and an impurity concentration of the fifth epitaxial layer 920 may be greater than an impurity concentration of the fourth epitaxial layer 910.

In some example embodiments, a portion of each of opposite sidewalls in the first direction of the first gate structure 632 may protrude from each of opposite sidewalls in the first direction of the first semiconductor patterns 426 to penetrate through a portion of the first epitaxial layer 820, but may not contact the second epitaxial layer 830. Additionally or alternatively, a portion of each of opposite sidewalls in the first direction of the second gate structure 634 may protrude from each of opposite sidewalls in the first direction of the second semiconductor patterns 428 to penetrate through a portion of the fourth epitaxial layer 910, but may not contact the fifth epitaxial layer 920. Accordingly, the lengths of the first and second gate structures 632 and 634 may be enlarged so that the leakage current may be reduced, and/or the first and second gate structures 632 and 634 may have enhanced control over the channels. However, the function of the first and second source/drain layers 840 and 930 for applying current and stress on the channels may not be influenced.

FIGS. 21 to 39 are plan views and cross-sectional views illustrating a method of manufacturing a semiconductor device in accordance with some example embodiments.

Particularly, FIGS. 21, 23, 26, 30 and 33 are the plan views, and FIGS. 22, 24-25, 27-29, 31-32 and 34-39 are the cross-sectional views.

Figure 22:
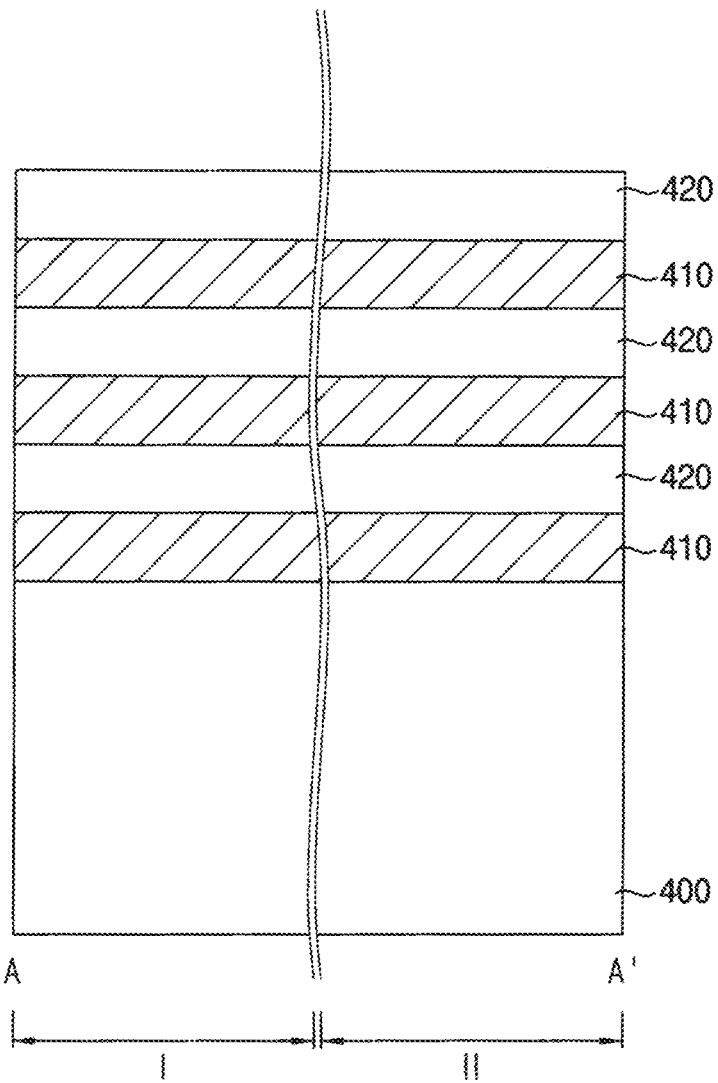
Figure 24:
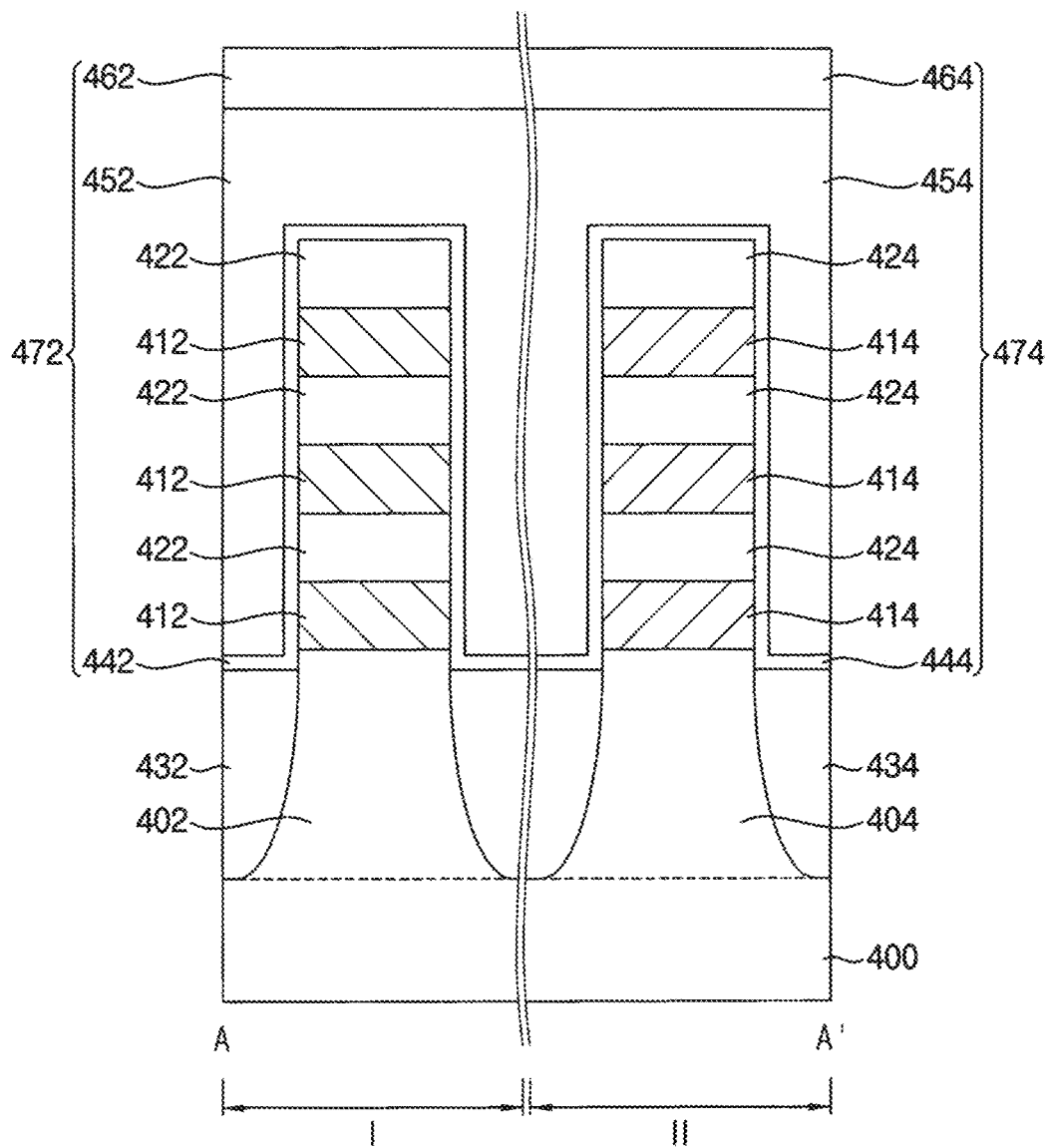

FIGS. 22 and 24 are cross-sectional views taken along lines A-A' of corresponding plan views, respectively, FIGS. 25, 27, 29, 31, 34, 36 and 38 are cross-sectional views taken along lines B-B' of corresponding plan views, respectively, and FIGS. 28, 32, 35, 37 and 39 are cross-sectional views taken along lines C-C' of corresponding plan views, respectively.

According to some example embodiments, the method may include processes substantially the same as or similar to those illustrated with reference to FIGS. 4 to 16 and FIGS. 1 to 3, and thus repeated descriptions thereon are omitted herein.

Figure 21:
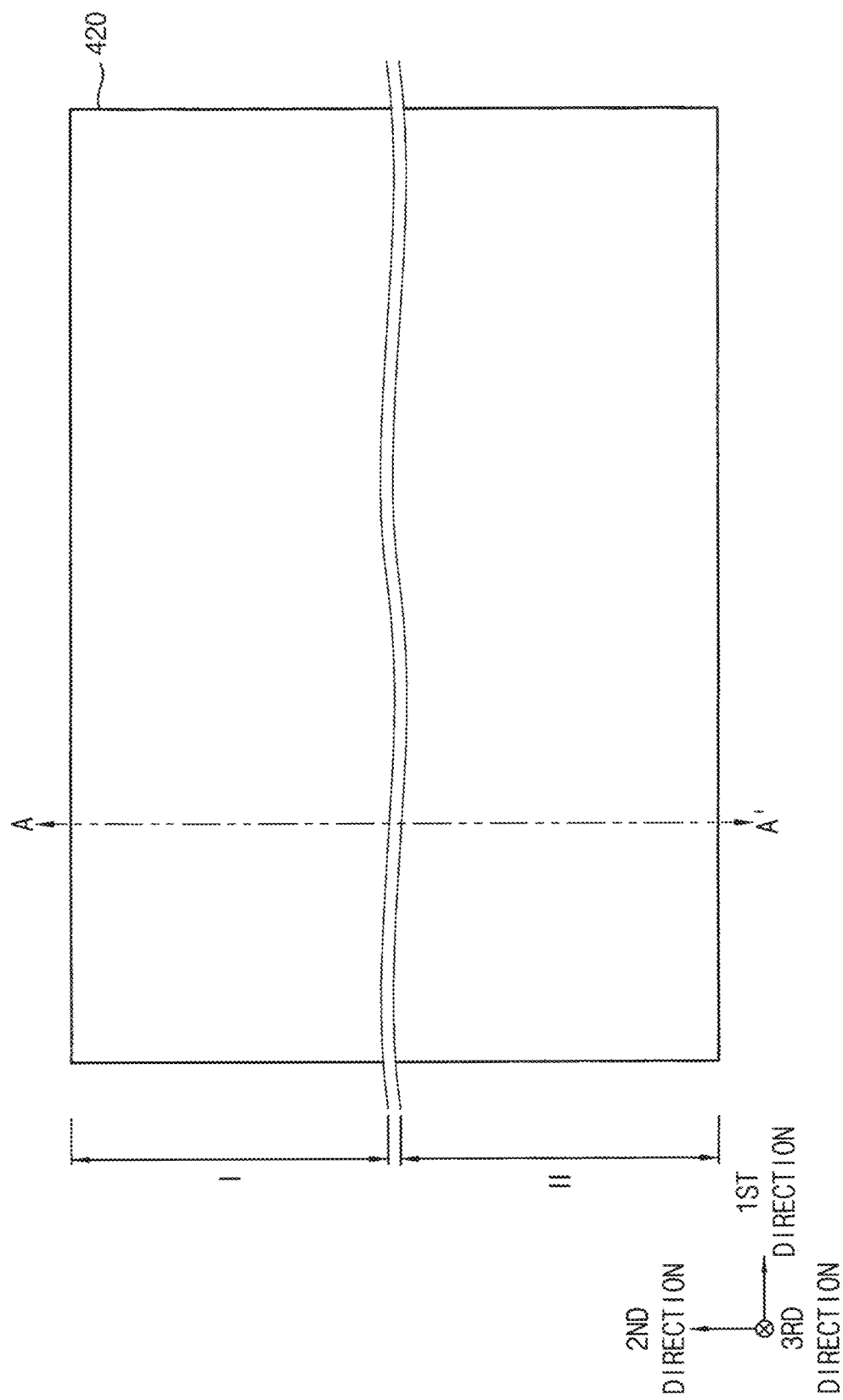

Referring to FIGS. 21 and 22, a sacrificial layer 410 and a semiconductor layer 420 may be alternately and repeatedly stacked on a substrate 400 including first and second regions I and II.

Figure 23:
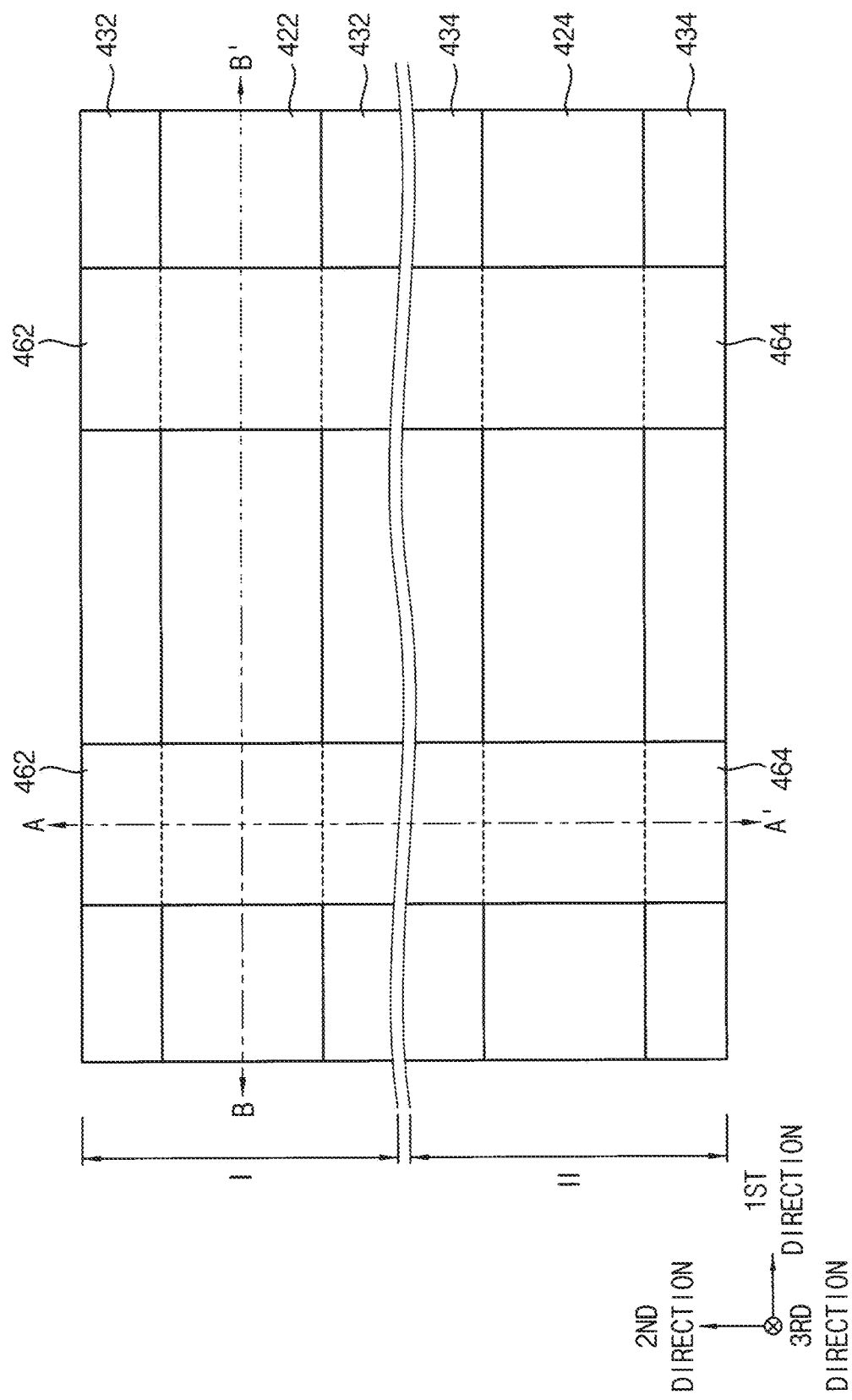
Figure 25:
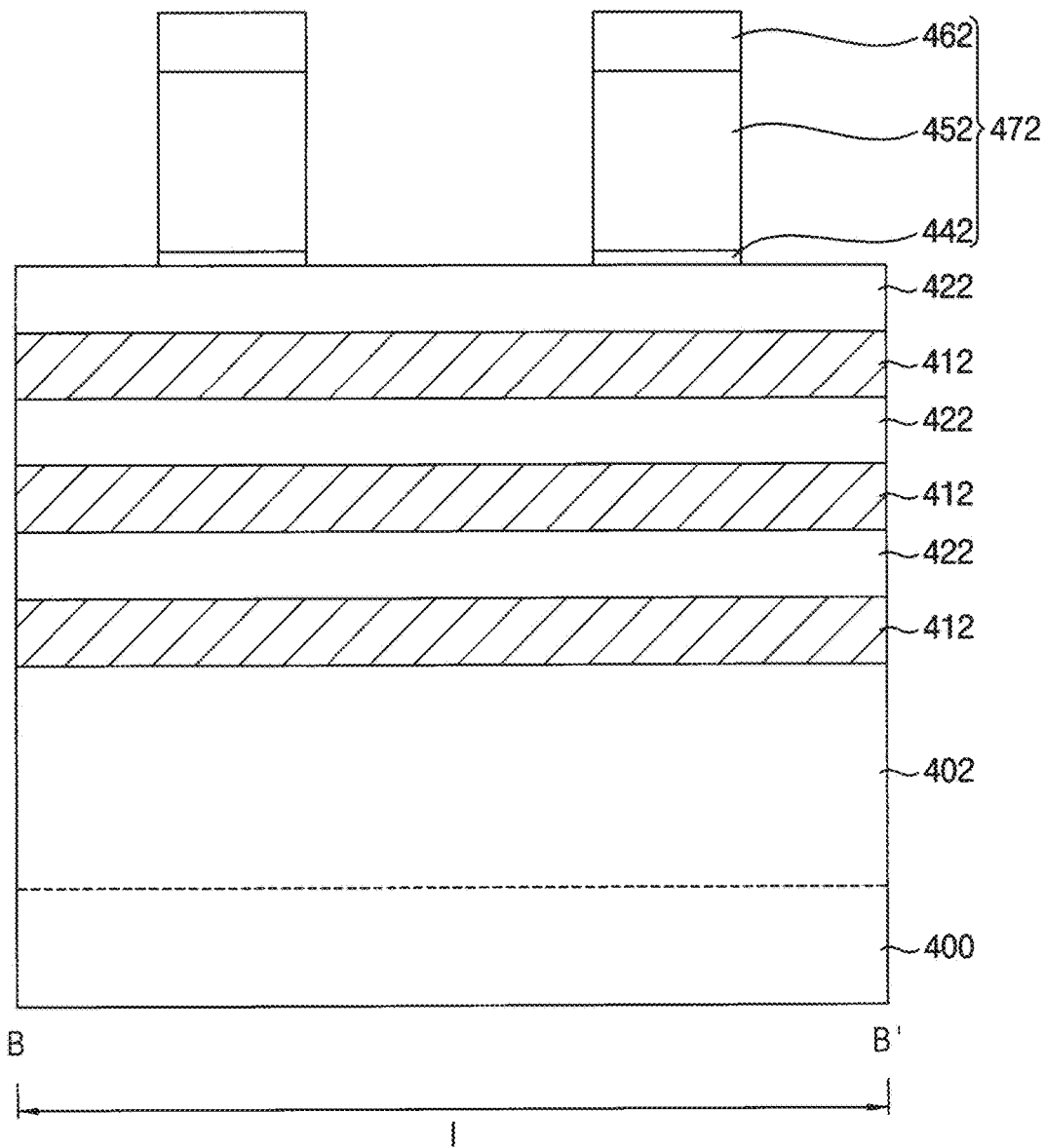
Figure 26:
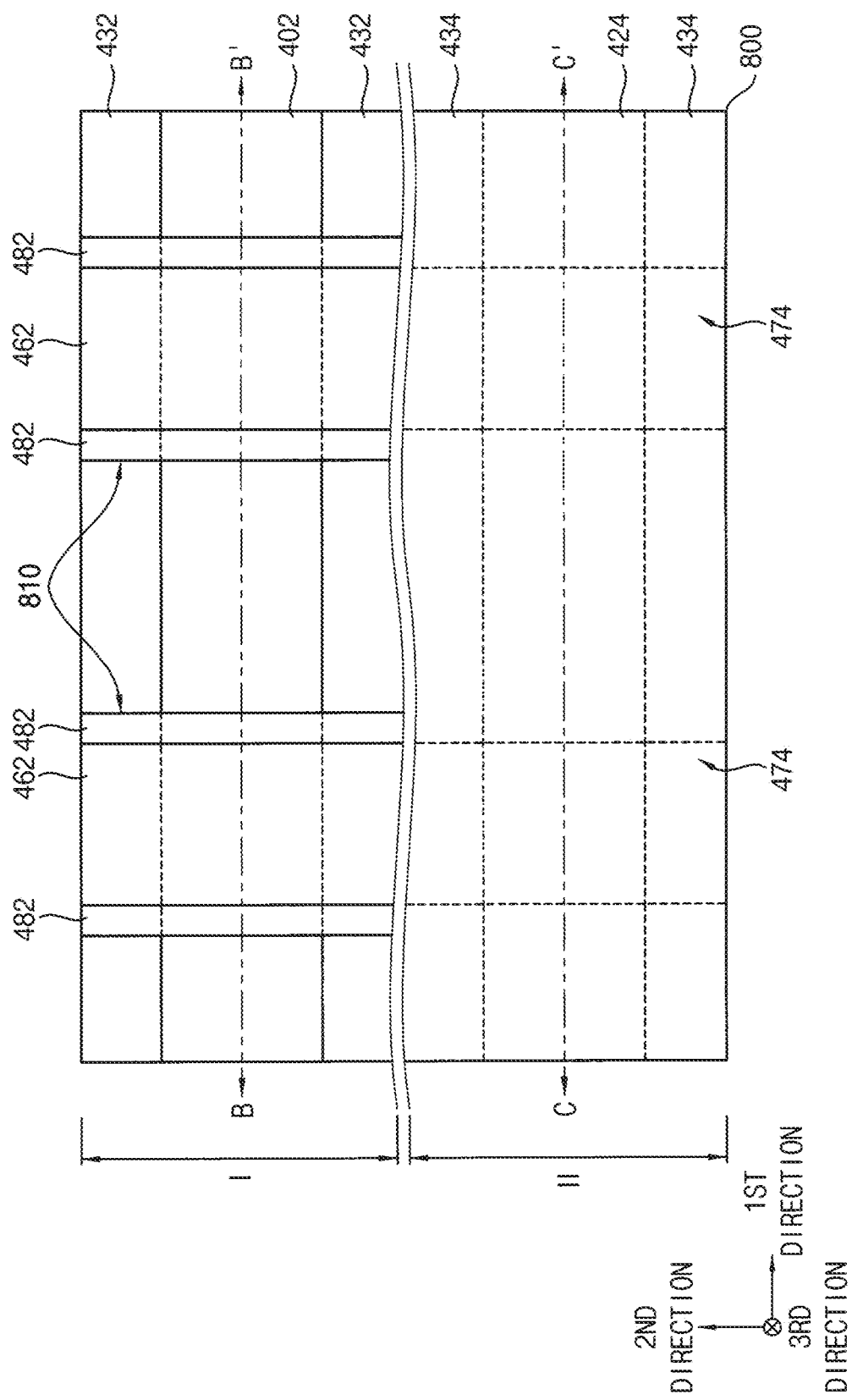

Referring to FIGS. 23 to 25, first and second etching masks extending in the first direction may be formed on an uppermost one of the semiconductor layers 420, and the semiconductor layers 420, the sacrificial layers 410 and an upper portion of the substrate 400 may be etched by using the first and second etching masks to form first and second active patterns 402 and 404 on the first and second regions I and II, respectively, of the substrate 400.

Thus, a first fin structure including first sacrificial lines 412 and first semiconductor lines 422 alternately and repeatedly stacked may be formed on the first active pattern 402, and a second fin structure including second sacrificial lines 414 and second semiconductor lines 424 alternately and repeatedly stacked may be formed on the second active pattern 404.

First and second isolation patterns 432 and 434 may be formed on the first and second regions I and II, respectively, of the substrate 400 to cover sidewalls of the first and second active patterns 402 and 404, respectively.

First and second dummy gate structures 472 and 474 may be formed on the first and second isolation patterns 432 and 434, respectively, to partially cover the first and second fin structures, respectively.

The first dummy gate structure 472 may include a first dummy gate insulation pattern 442, a first dummy gate electrode 452 and a first dummy gate mask 462 sequentially stacked on the first fin structure and a portion of the first isolation pattern 432 adjacent thereto, and the second dummy gate structure 474 may include a second dummy gate insulation pattern 444, a second dummy gate electrode 454 and a second dummy gate mask 464 sequentially stacked on the second fin structure and a portion of the second isolation pattern 434 adjacent thereto.

Referring to FIGS. 41 to 43, a first spacer layer 480 may be formed on the substrate 400 having the first and second fin structures, the first and second isolation patterns 432 and 434, and the first and second dummy gate structures 472 and 474 thereon, a first photoresist pattern 800 may be formed on the first spacer layer 480 to cover the second region II of the substrate 400, and a portion of the first spacer layer 480 on the first region I of the substrate 400 may be etched using the first photoresist pattern 800 as an etching mask.

Thus, a first gate spacer 482 may be formed to cover each of opposite sidewalls in the first direction of the first dummy gate structure 472.

The exposed first fin structure and an upper portion of the first active pattern 402 thereunder may be etched, e.g. isotropically etched with a wet etching process and/or a dry etching process, using the first dummy gate structure 472 and the first gate spacer 482 as an etching mask to form a fifth opening 810.

Thus, the first sacrificial lines 412 and the first semiconductor lines 422 under the first dummy gate structure 472 and the first gate spacer 482 may be transformed into first sacrificial patterns 416 and first semiconductor patterns 426, respectively, and the first fin structure extending in the first direction may be divided into a plurality of pieces spaced apart from each other in the first direction. Hereinafter, the first dummy gate structure 472, the first gate spacers 482 on opposite sidewalls in the first direction of the first dummy gate structure 472, and the first fin structure may be referred to as a first structure.

In some example embodiments, a sidewall in the first direction of the fifth opening 810 may have a convex shape. Sidewalls in the first direction of the first semiconductor patterns 426 may not be perpendicular but slanted with respect to an upper surface of the substrate 400. Thus, lengths in the first direction of the first semiconductor patterns 426 may not be constant in the third direction.

Figure 29:
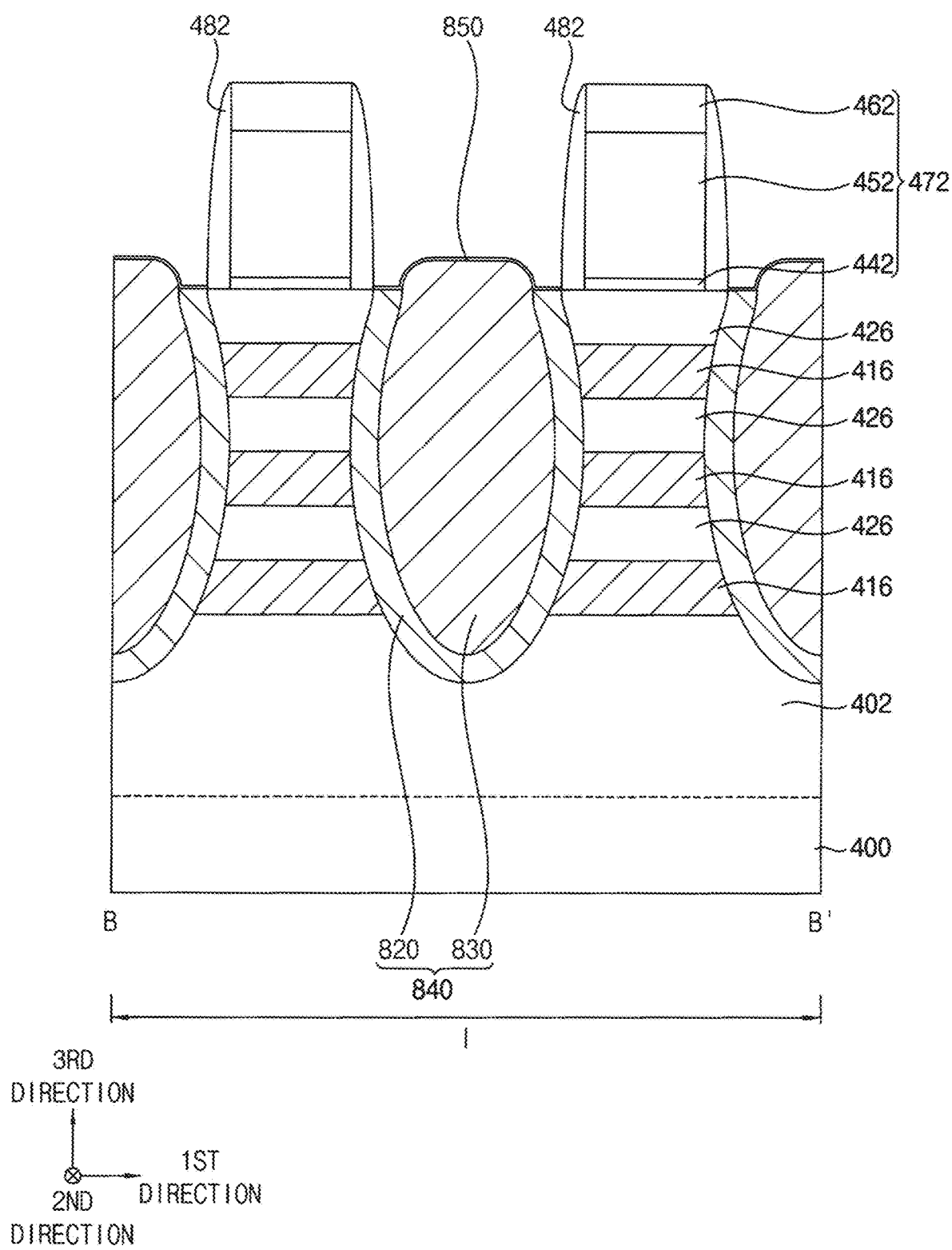

Referring to FIG. 29, after removing the first photoresist pattern 800, processes substantially the same as or similar to those illustrated with reference to FIG. 11 may be performed, and a first source/drain layer 840 may be formed to fill the fifth opening 810.

Particularly, a sixth SEG process may be performed using sidewalls of the first semiconductor patterns 426 and the first sacrificial patterns 416 exposed by the fifth opening 810 as a seed, e.g. as seeding layers, to form a first epitaxial layer 820 on an inner wall of the fifth opening 810. The first epitaxial layer 820 may be or include a single crystalline silicon-germanium layer doped with p-type impurities, and may have a first impurity concentration. The silicon-germanium layer may be doped with p-type impurities by inclusion of a p-type dopant such as boron during the SEG process. Alternatively or additionally, the silicon-germanium layer may be doped with p-type impurities by an implantation process (not shown).

A seventh SEG process may be performed to form a second epitaxial layer 830 filling a remaining portion of the fifth opening 810. The second epitaxial layer 830 may be a single crystalline silicon-germanium layer doped with p-type impurities, and may have a second impurity concentration greater than the first impurity concentration and a germanium concentration greater than that of the first epitaxial layer 820.

The first and second epitaxial layers 820 and 830 may form the first source/drain layer 840, and may serve as a source/drain of a p-type transistor.

An eighth SEG process may be optionally performed to form a third epitaxial layer 850. The third epitaxial layer 850 may be an undoped single crystalline silicon layer, and may cover an upper surface of the first source/drain layer 840 with a thin thickness.

Figure 30:
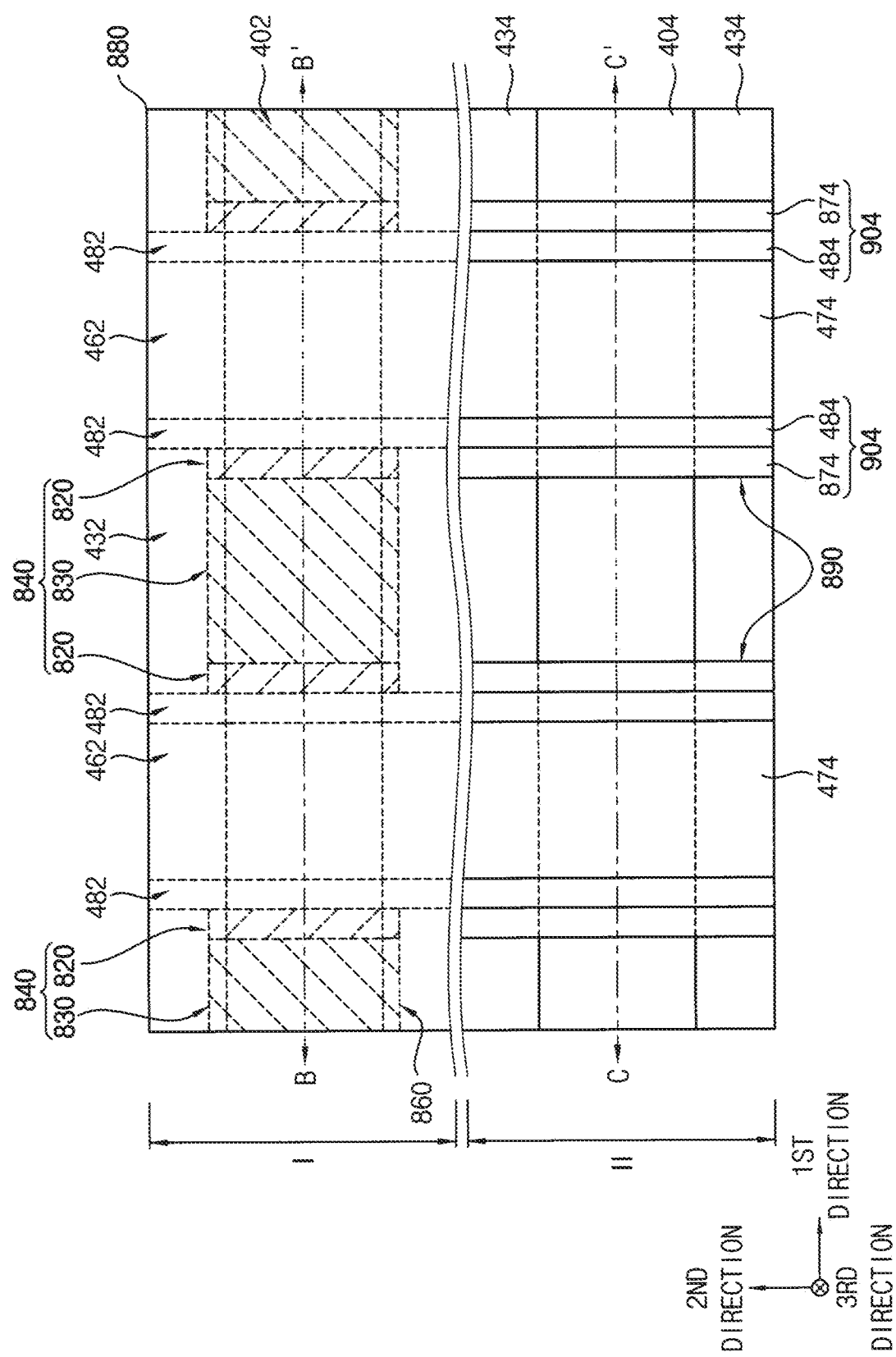
Figure 31:
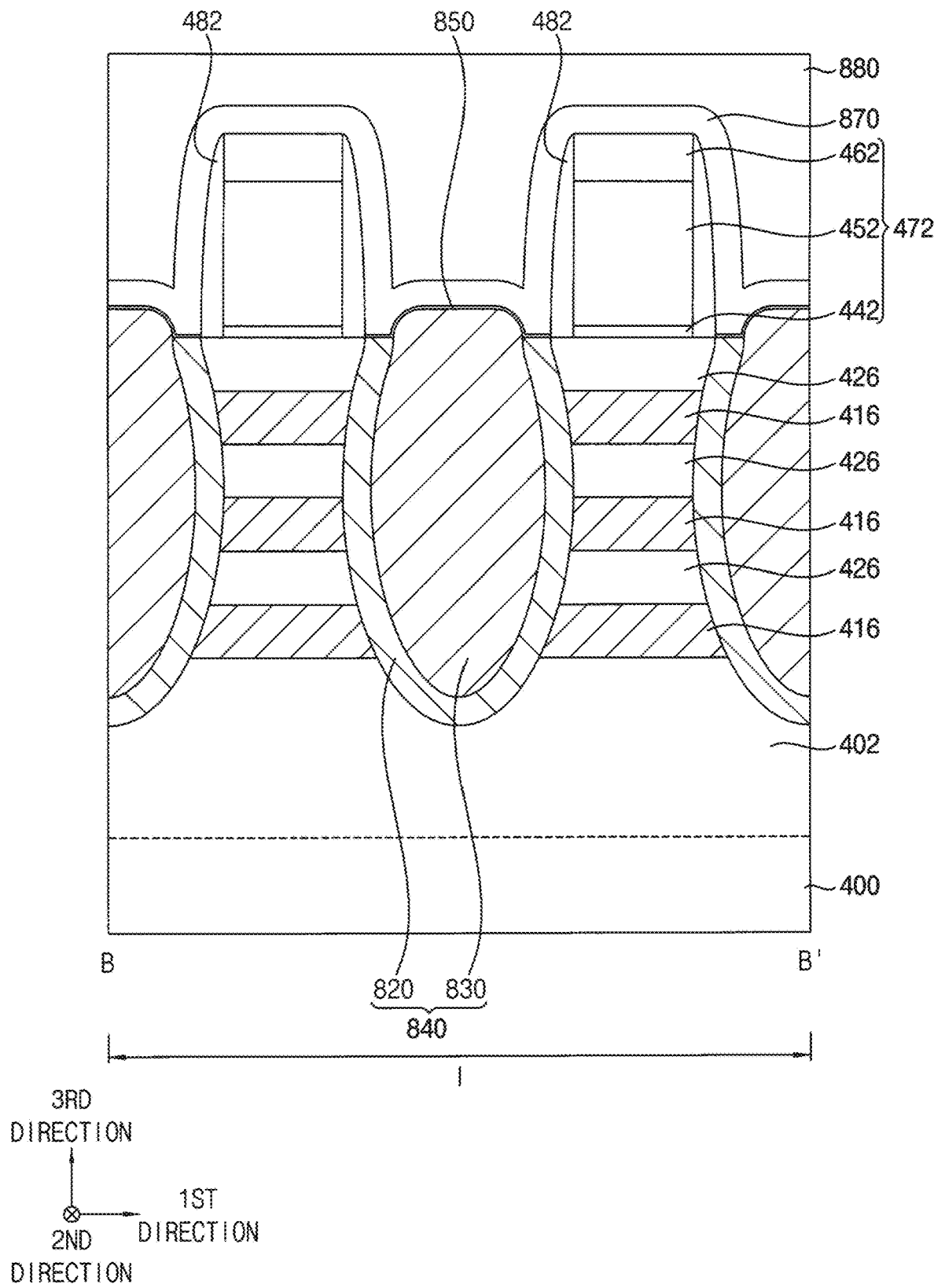
Figure 32:
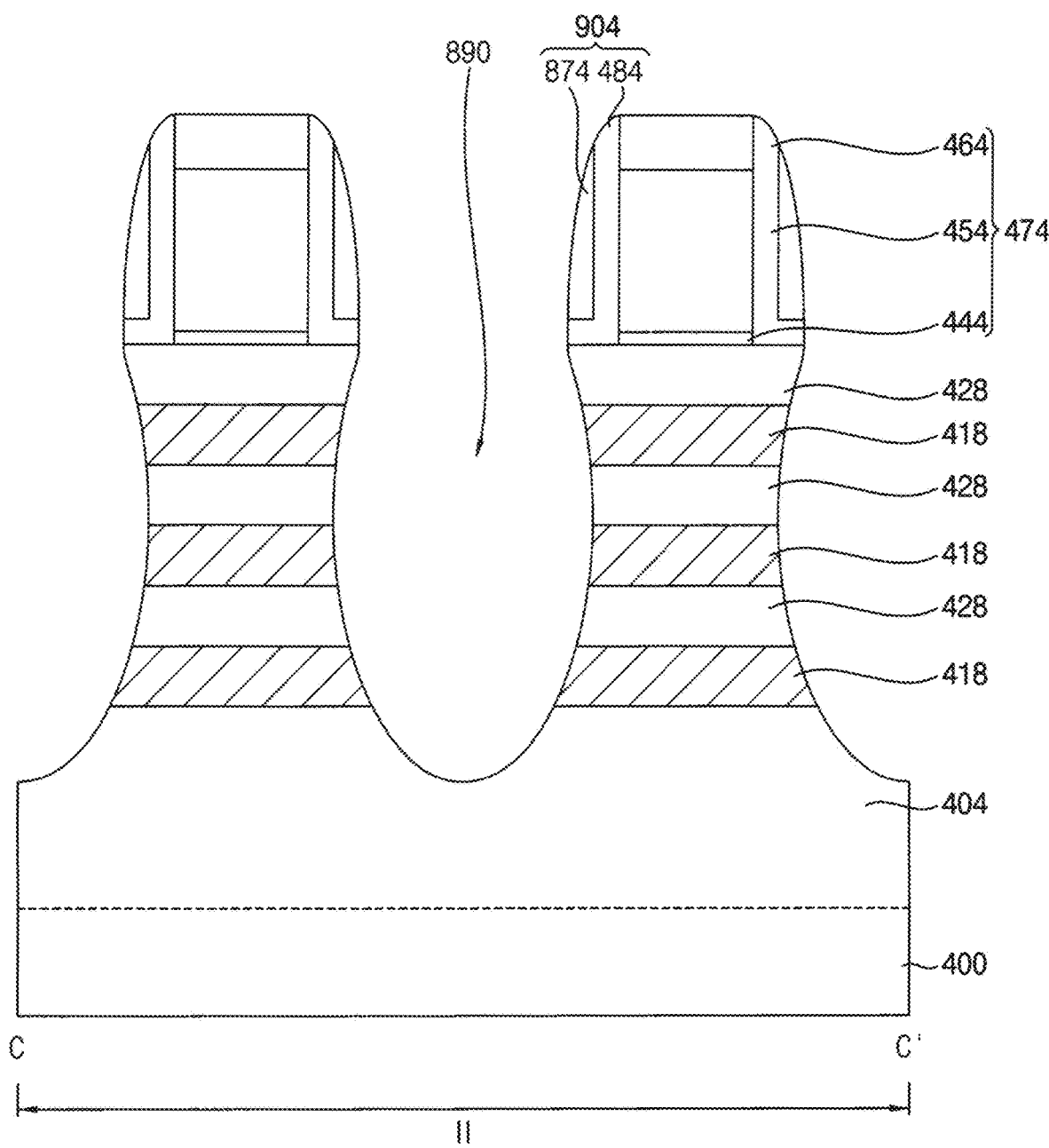

Referring to FIGS. 30 to 32, a second spacer layer may be formed on the substrate 400 having the first fin structure, the first source/drain layer 840, the first isolation pattern 432 and the first spacer layer 480 thereon, a second photoresist pattern 880 may be formed on the second spacer layer 870 to cover the first region I of the substrate 400, and a portion of the second spacer layer 870 on the second region II of the substrate 400 may be removed by an etching process using the second photoresist pattern 880 as an etching mask.

Thus, a fourth gate spacer 874 may be formed to cover the second dummy gate structure 474 and opposite sidewalls in the first direction of the first spacer layer 480 on a surface of the second dummy gate structure 474.

The first spacer layer 480 may be anisotropically etched to form a third gate spacer 484 covering each of opposite sidewalls in the first direction of the second dummy gate structure 474. A portion of the first spacer layer 480 under the fourth gate spacer 874 may remain to form a portion of the third gate spacer 484, and thus the third gate spacer 484 may have a cross-section in the first direction of an "L" shape. The third and fourth gate spacers 484 and 874 sequentially stacked may form a second gate spacer structure 904.

The exposed second fin structure and an upper portion of the second active pattern 404 thereunder may be etched using the second dummy gate structure 474 and the second gate spacer structures 904 as an etching mask to form a sixth opening 890.

Thus, the second sacrificial lines 414 and the second semiconductor lines 424 under the second dummy gate structure 474 and the second gate spacer structures 904 may be transformed into second sacrificial patterns 418 and second semiconductor patterns 428, respectively, and the second fin structure extending in the first direction may be divided into a plurality of pieces spaced apart from each other in the first direction. Hereinafter, the second dummy gate structure 474, the second gate spacer structures 474 on opposite sidewalls in the first direction of the second dummy gate structure 474, and the second fin structure may be referred to as a second structure.

Figure 33:
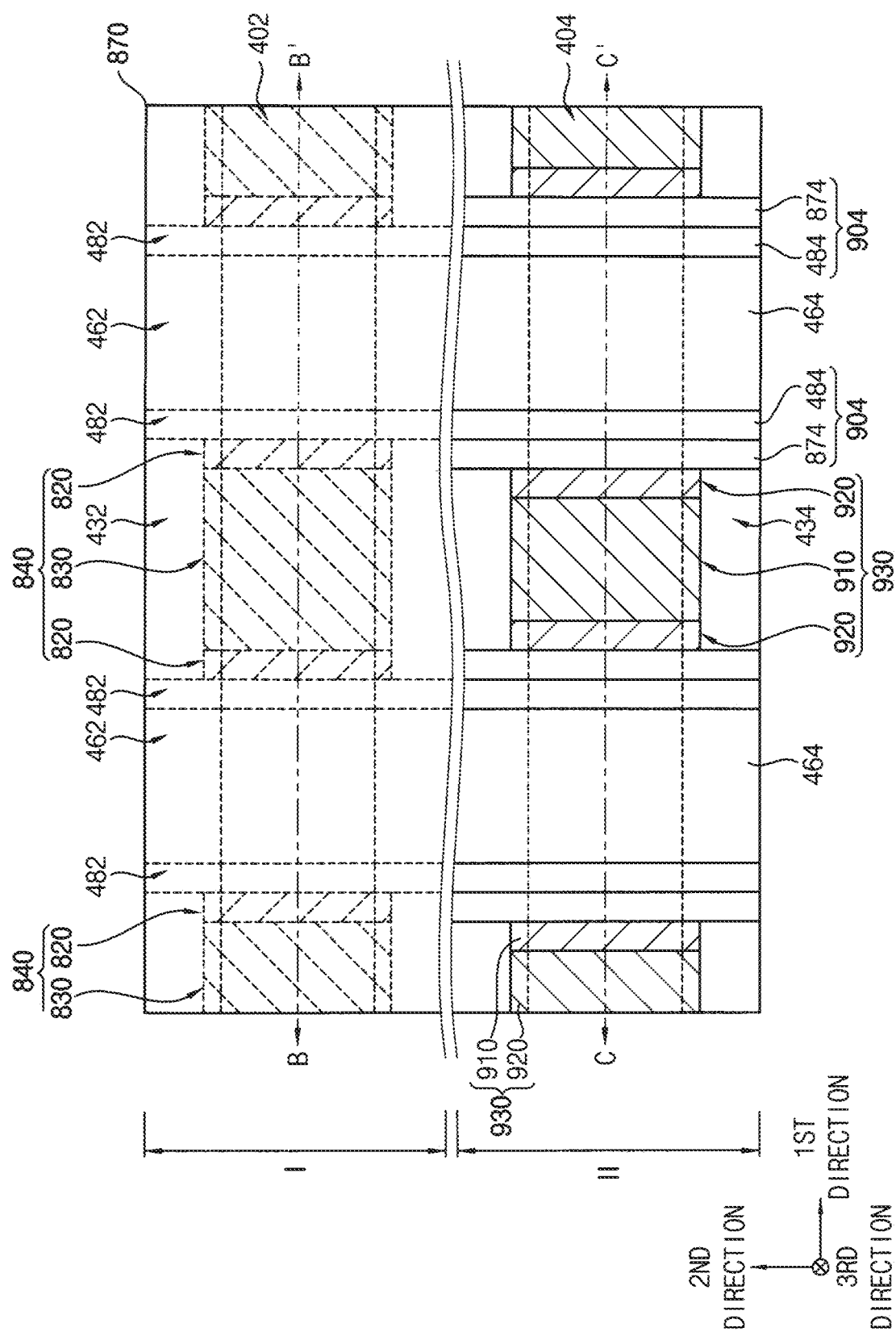
Figure 34:
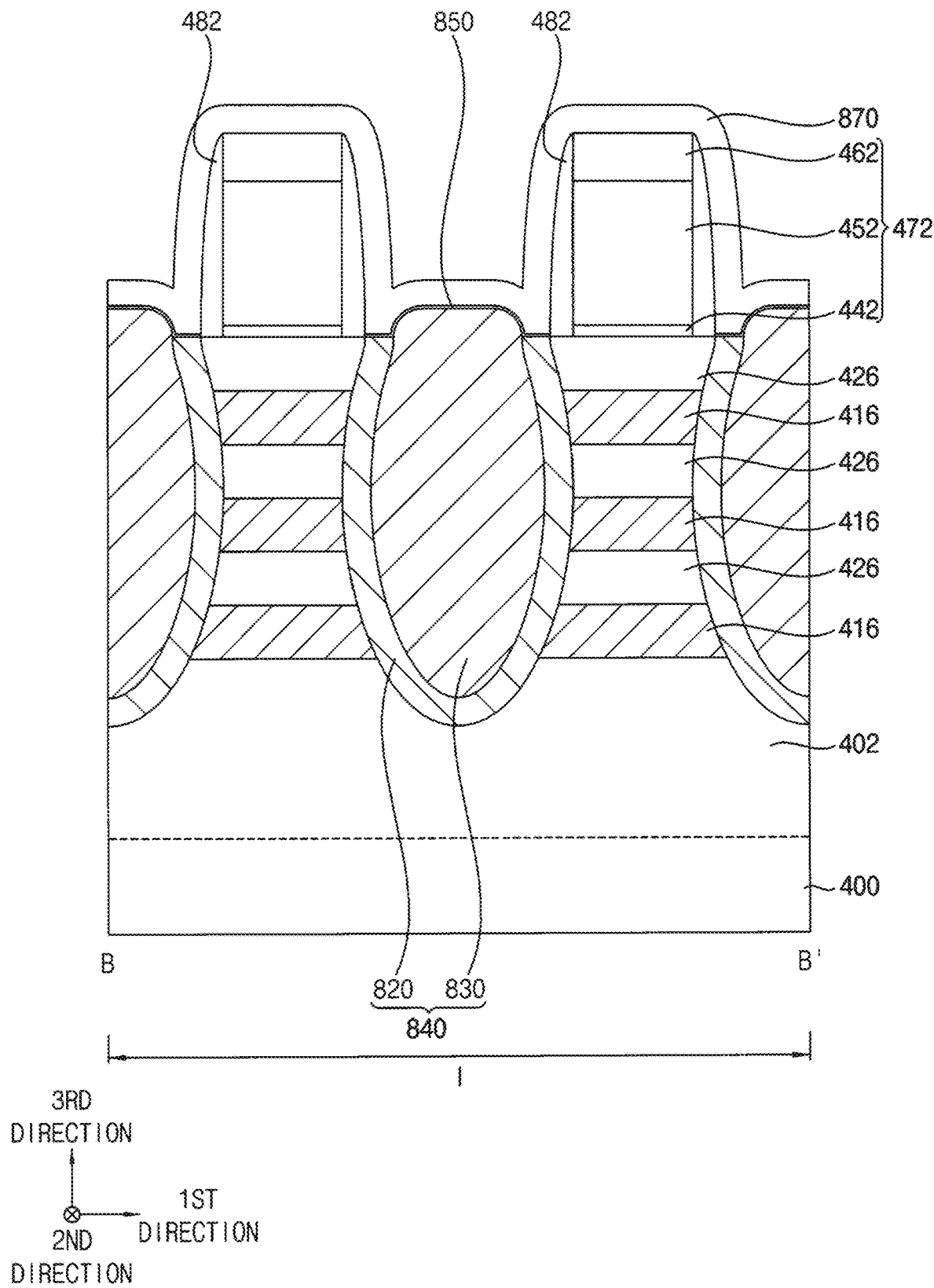
Figure 35:
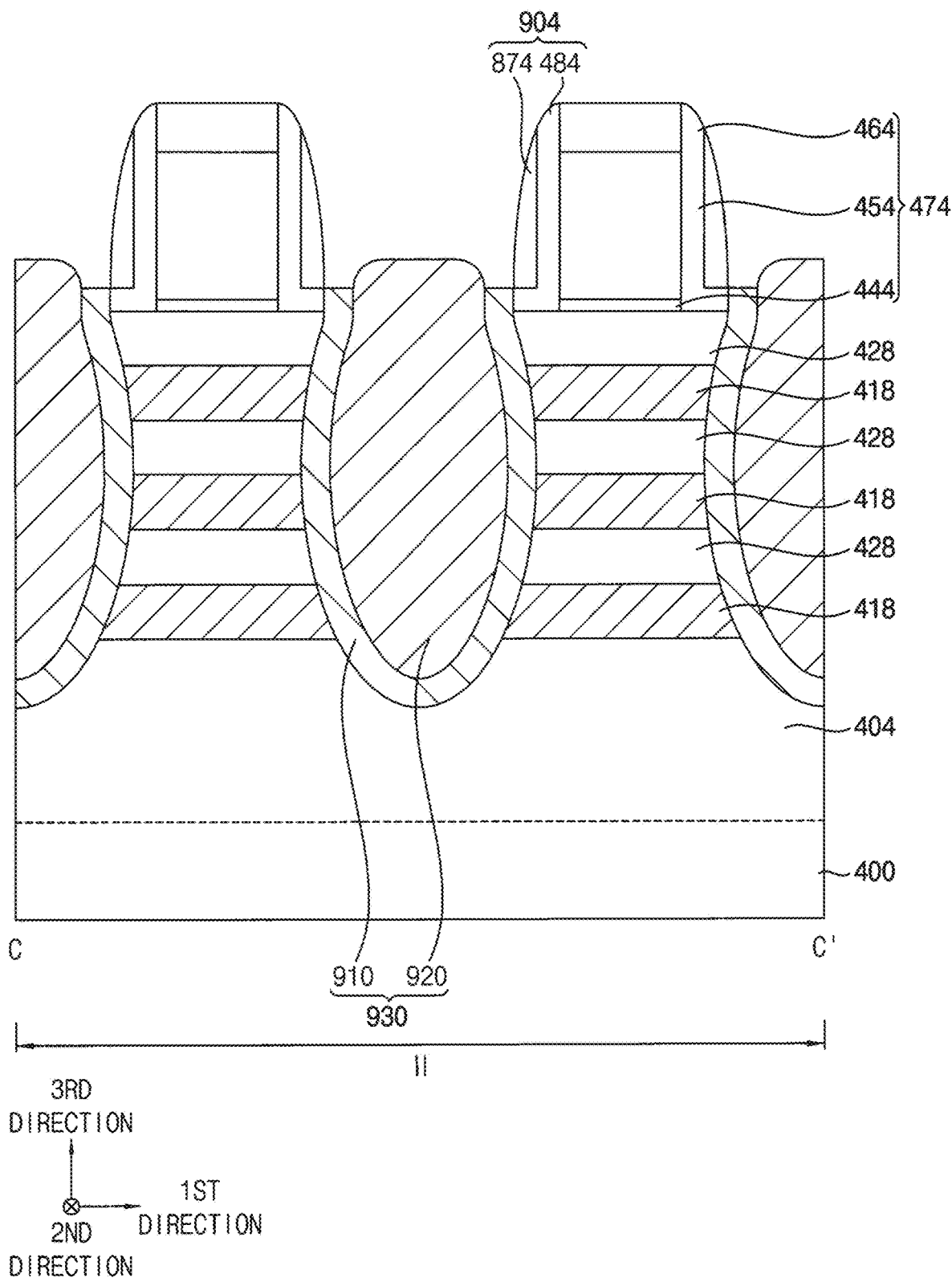

Referring now to FIGS. 33 to 35, after removing the second photoresist pattern 880, processes substantially the same as or similar to those illustrated with reference to FIG. 11 may be performed to form a second source/drain layer 930 filling the sixth opening 890.

Particularly, a ninth SEG process may be performed using sidewalls of the second semiconductor patterns 428 and the second sacrificial patterns 418 exposed by the sixth opening 890 as a seed/seeding layers to form a fourth epitaxial layer 910 on an inner wall of the sixth opening 890. The fourth epitaxial layer 910 may be a single crystalline silicon layer doped with n-type impurities, and may have a third impurity concentration. The single crystalline silicon layer may be doped with n-type impurities during formation, and/or may be implanted with n-type impurities in an implantation process (not shown).

A tenth SEG process may be performed to form a fifth epitaxial layer 920 filling a remaining portion of the sixth opening 890. The fifth epitaxial layer 920 may be or include a single crystalline silicon layer having/doped with n-type impurities, and may have a fourth impurity concentration greater than the third impurity concentration.

The fourth and fifth epitaxial layers 910 and 920 may form the second source/drain layer 930, and may serve as a source/drain of a n-type transistor.

Figure 36:
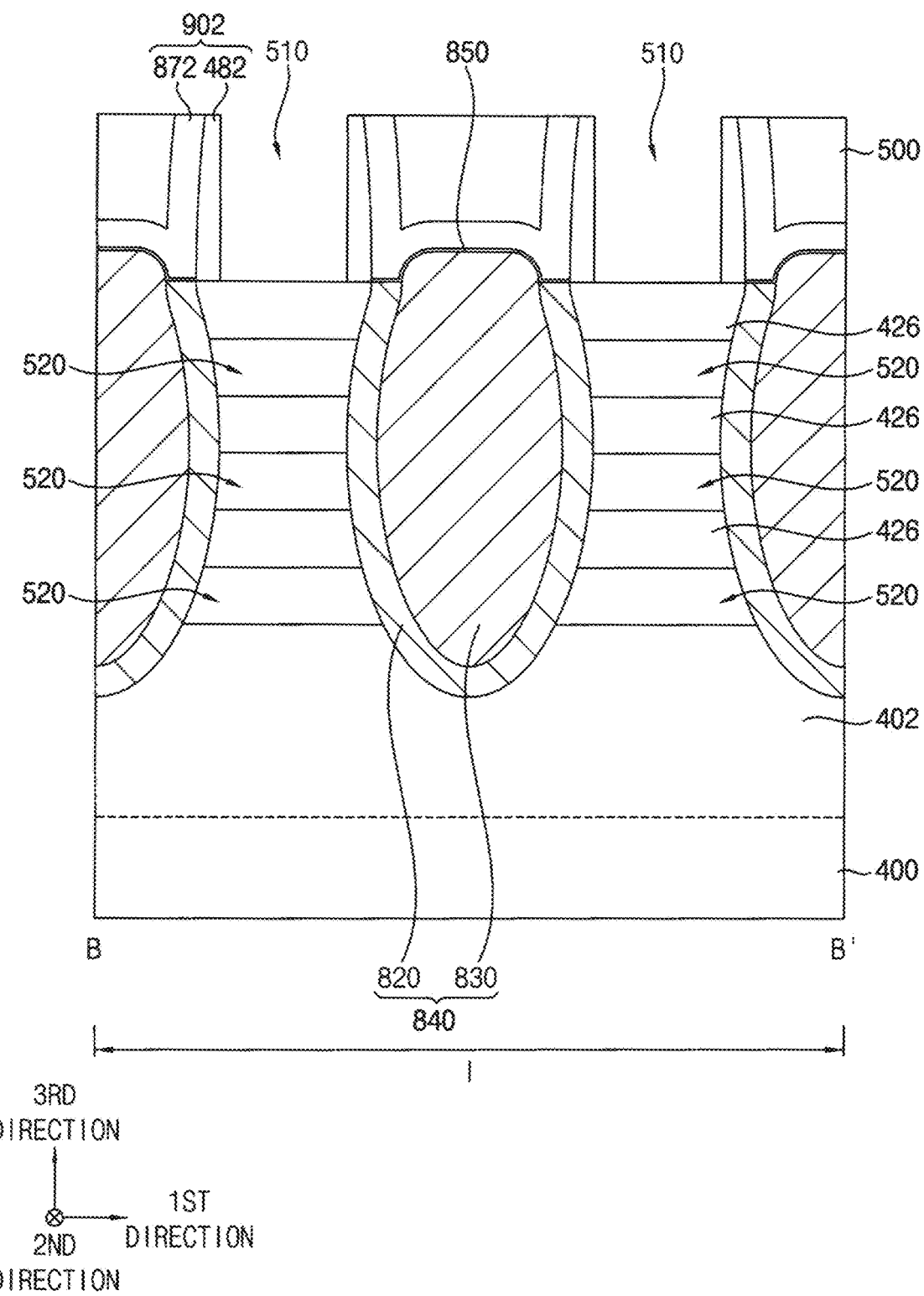
Figure 37:
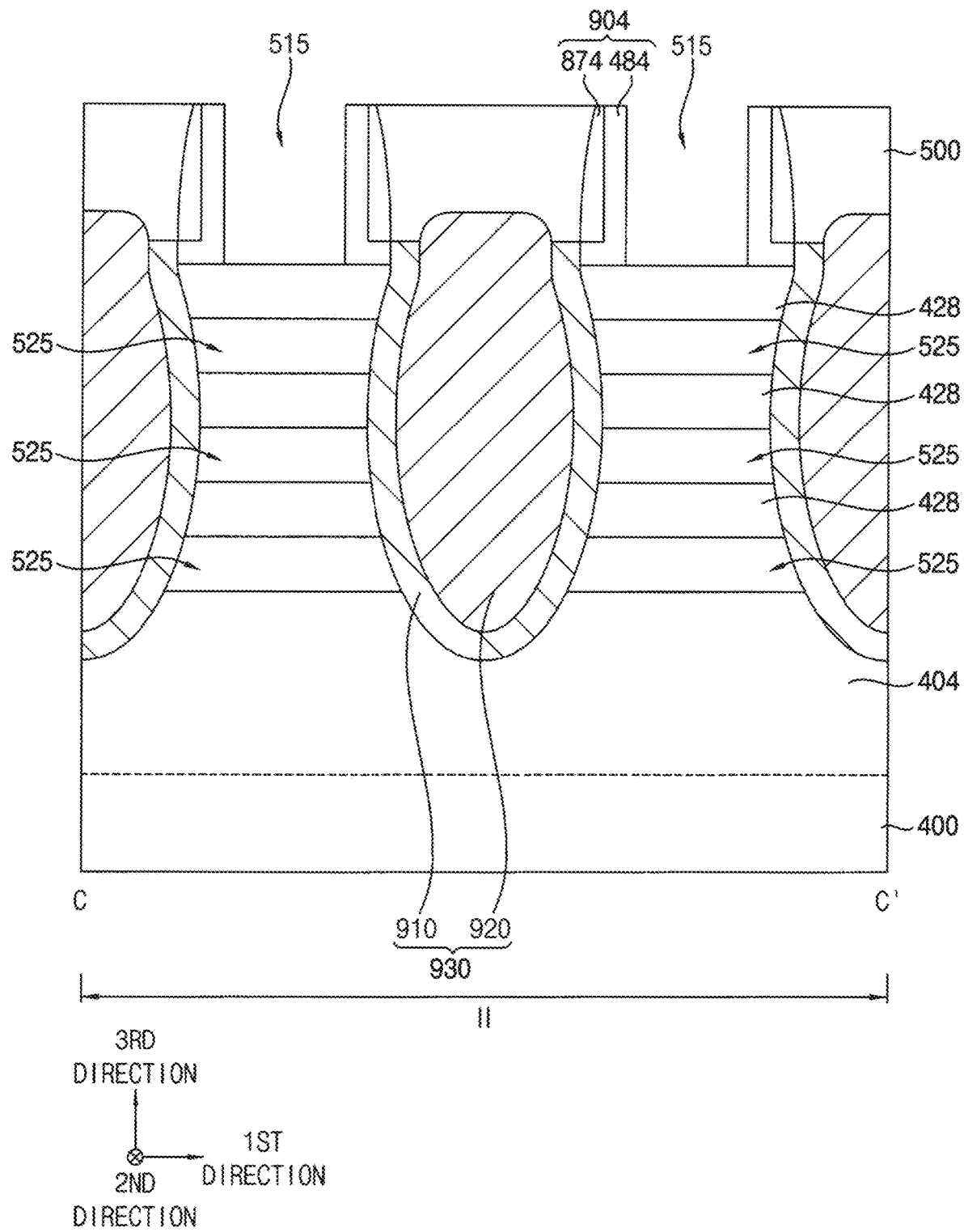

Referring to FIGS. 36 and 37, processes substantially the same as or similar to those illustrated with reference to FIG. 12 may be performed.

Thus, an insulating interlayer 500 may be formed on the second isolation pattern 434 to cover the first and second structures, the second spacer layer 870, and the first and second source/drain layers 840 and 930, and may be planarized until the first and second dummy gate electrodes 452 and 454 of the first and second structures, respectively, are exposed.

During the planarization process, the first and second dummy gate masks 462 and 464 may be also removed, and an upper portion of the second gate spacer structure 904 may be partially removed. An upper portion of the second spacer layer 870 may be removed to form a second gate spacer 872 on an outer sidewall of the first gate spacer 482, and the first and second gate spacers 482 and 872 may form/correspond to a first gate spacer structure 902. The first gate spacer 482 and the second gate spacer 472 may include the same, and/or may include different, materials. For example, the first gate spacer 482 and/or the second gate spacer 472 may include nitride.

The exposed first dummy gate electrode 452, the first dummy gate insulation pattern 442 and the first sacrificial patterns 416 may be removed to form seventh and eighth openings 510 and 520 on the first region I of the substrate 400, and the exposed second dummy gate electrode 454, the second dummy gate insulation pattern 444 and the second sacrificial patterns 418 may be removed to form ninth and tenth openings 515 and 525 on the second region II of the substrate 400.

Figure 38:
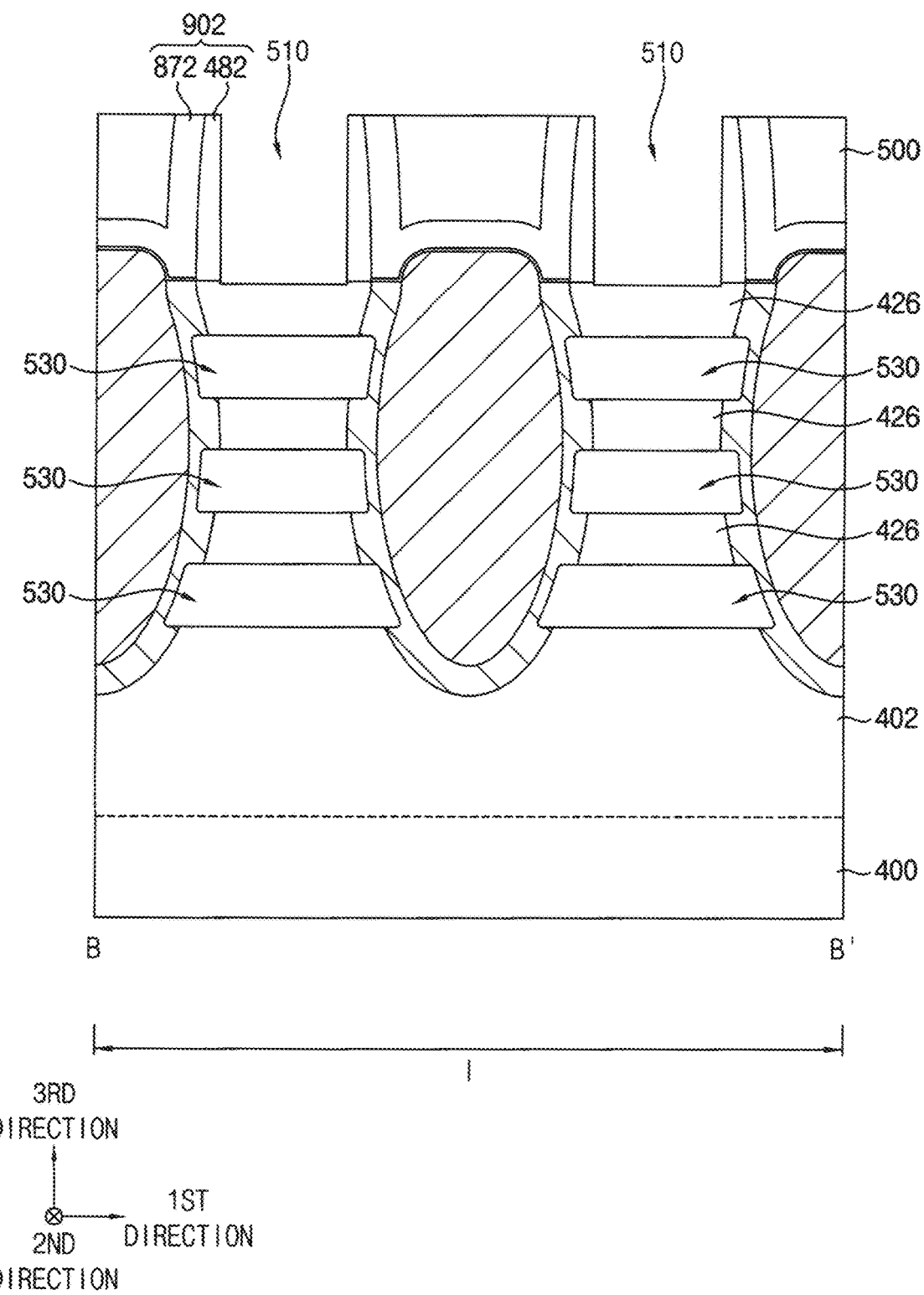
Figure 39:
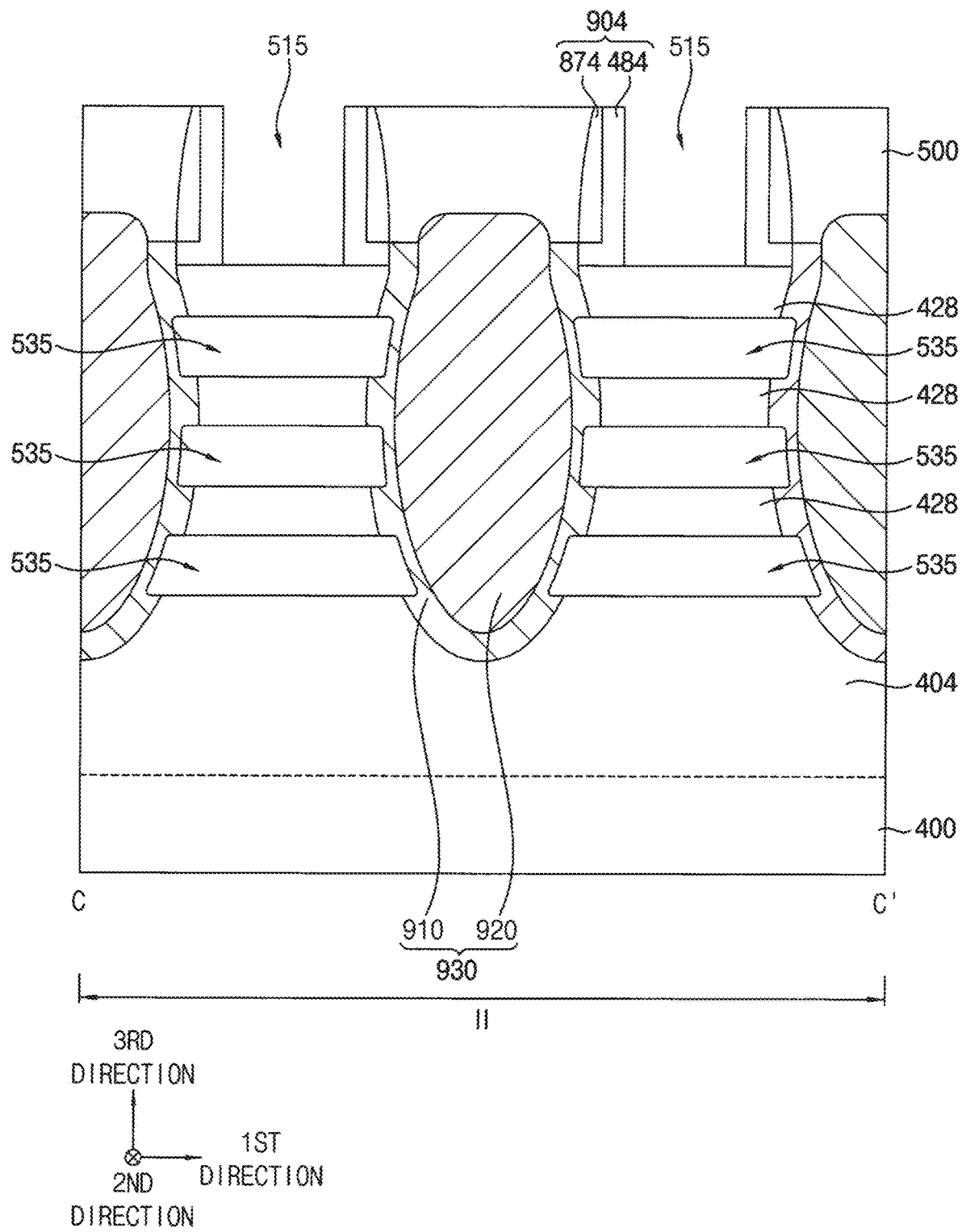

Referring to FIGS. 38 and 39, processes substantially the same as or similar to those illustrated with reference to FIGS. 13 and 14 may be performed.

Thus, an oxidation process may be performed on surfaces of the first and second semiconductor patterns 426 and 428, upper surfaces of the first and second active patterns 402 and 404, and sidewalls of the first and second source/drain layers 840 and 930 exposed by the seventh to tenth openings 510, 520, 515 and 525 and including silicon to form an oxide layer including silicon oxide or germanium oxide, and may be removed by an etching process.

Accordingly, a width in the first direction of the eighth opening 520 may be enlarged to form an eleventh opening 530, and a width in the first direction of the tenth opening 525 may be enlarged to form a twelfth opening 535.

In some example embodiments, a sidewall of the eleventh opening 530 may be formed within the first epitaxial layer 820 of the first source/drain layer 840, and may not be enlarged to the second epitaxial layer 830. Additionally, a sidewall of the twelfth opening 535 may be formed within the fourth epitaxial layer 910 of the second source/drain layer 930, and may not be enlarged to the fifth epitaxial layer 920.

Referring to FIGS. 17 to 20 again, processes substantially the same as or similar to those illustrated with reference to FIGS. 15 and 16 may be performed.

Thus, first and second gate structures 632 and 634 may be formed in the eleventh and twelfth openings 530 and 535, respectively.

The first gate structure 632 may include a first interface pattern 592, a first gate insulation pattern 602, a first workfunction control pattern 612, and a first gate electrode 622 sequentially stacked, and the second gate structure 634 may include a second interface pattern 594, a second gate insulation pattern 604, a second workfunction control pattern 614, and a second gate electrode 624 sequentially stacked.

Processes substantially the same as or similar to those illustrated with reference to FIGS. 1 to 3 may be performed to form an additional insulating interlayer (not shown) and contact plugs (not shown), and thus the fabrication of the semiconductor device may be completed.

The foregoing is illustrative of some example embodiments and is not to be construed as limiting thereof. Although a few some example embodiments have been described, those of ordinary skill in the art will readily appreciate that many modifications are possible in the some example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various some example embodiments and is not to be construed as limited to the specific some example embodiments disclosed, and that modifications to the disclosed some example embodiments, as well as other some example embodiments, are intended to be included within the scope of the appended claims.

What is claimed is:

1. A semiconductor device, comprising:
channels spaced apart from each other in a vertical direction that is perpendicular to an upper surface of a substrate, each of the channels extending in a first direction that is parallel to the upper surface of the substrate;
a gate structure extending on the substrate in a second direction, the second direction parallel to the upper surface of the substrate and crossing the first direction, the gate structure covering lower surfaces, upper surfaces, first sidewalls, and second sidewalls of the channels, the first sidewalls of the channels opposite the second sidewalls of the channels in the second direction; and
a source/drain layer on the substrate, the source/drain layer being connected to each of the first sidewalls and the second sidewalls of the channels in the first direction of the channels, the source/drain layer including a semiconductor material having impurities, and the source/drain layer including,
a second epitaxial layer having a second impurity concentration, and
a first epitaxial layer covering a lower surface of the second epitaxial layer and covering first and second sidewalls of the second epitaxial layer that are opposite in the first direction, the first epitaxial layer having a first impurity concentration less than the second impurity concentration,
wherein a portion of each of first and second sidewalls of the gate structure that are opposite each other in the first direction protrudes in the first direction from corresponding ones of the first sidewalls and the second sidewalls of the channels in the first direction to penetrate through a portion of the first epitaxial layer but not to contact the second epitaxial layer.

2. The semiconductor device as claimed in claim 1, wherein the source/drain layer includes silicon-germanium having p-type impurities.

3. The semiconductor device as claimed in claim 2, wherein the second impurity concentration of the second epitaxial layer is greater than or equal to ten times the first impurity concentration of the first epitaxial layer.

4. The semiconductor device as claimed in claim 2, wherein a germanium concentration of the first epitaxial layer is less than a germanium concentration of the second epitaxial layer.

5. The semiconductor device as claimed in claim 2, further comprising:
a third epitaxial layer covering an upper surface of the source/drain layer, the third epitaxial layer including undoped silicon.

6. The semiconductor device as claimed in claim 1, wherein the source/drain layer includes silicon having n-type impurities.

7. The semiconductor device as claimed in claim 6, wherein the second impurity concentration of the second epitaxial layer is greater than or equal to two times the first impurity concentration of the first epitaxial layer.

8. The semiconductor device as claimed in claim 1, wherein an upper surface of the second epitaxial layer protrudes from an upper surface of the first epitaxial layer in the vertical direction, and an uppermost surface of the second epitaxial layer is at a higher level than an uppermost surface of the first epitaxial layer.

9. The semiconductor device as claimed in claim 1, wherein lengths in the first direction of portions of the gate structure between the channels are not constant but vary along the vertical direction.

10. The semiconductor device as claimed in claim 1, wherein the channels include first, second, and third channels, the first, second, and third channels sequentially stacked in the vertical direction, and
each of lengths in the first direction of a first portion of the gate structure and a second portion of the gate structure are greater than a length in the first direction of a third portion of the gate structure,
the first portion between an upper surface of the substrate and the first channel,
the second portion between the second and third channels, and
the third portion between the first and second channels.

11. The semiconductor device as claimed in claim 10, wherein a length in the first direction of a portion of the gate structure on the third channel is less than or equal to each of the lengths in the first direction of portions of the gate structure under the third channel.

12. The semiconductor device as claimed in claim 1, wherein a maximum length in the first direction of the gate structure is greater than a maximum length in the first direction of the channels.

13. The semiconductor device as claimed in claim 1, wherein the portion of each of the first sidewall and the second sidewall of the gate structure protruding in the first direction from the corresponding first sidewalls and the second sidewall of the channels is under an uppermost one of the channels.

14. The semiconductor device as claimed in claim 1, further comprising:
a gate spacer on each of a first sidewall a second sidewall of a portion of the gate structure on an uppermost one of the channels, the first sidewall of the portion of the gate structure opposite the second sidewall of the portion of the gate structure in the first direction,
wherein at least a portion of a portion of the gate structure under the uppermost one of the channels protrudes in the first direction from the first or second sidewall of the gate spacer that is an outer sidewall.

15. A semiconductor device, comprising:
channels spaced apart from each other in a vertical direction perpendicular to an upper surface of a substrate, each of the channels extending in a first horizontal direction parallel to the upper surface of the substrate;
a gate structure on the substrate, the gate structure partially covering each of the channels and extending in a second horizontal direction that crosses the first horizontal direction; and a source/drain layer on the substrate, the source/drain layer connected to each of a first sidewall and a second sidewall of the channels, the first sidewall of the channel opposite the second sidewall of the channel in the first horizontal direction, the source/drain layer including a semiconductor material having impurities, and the source/drain layer including, a second epitaxial layer having a second impurity concentration, and a first epitaxial layer covering a lower surface and a first and second sidewall of the second epitaxial layer, the first sidewall of the first epitaxial layer opposite the second sidewall of the first epitaxial layer in the first horizontal direction, the first epitaxial layer having a first impurity concentration less than the second impurity concentration, wherein a length in the first horizontal direction of a portion of the gate structure between corresponding ones of the channels that neighbor in the vertical direction is greater than each of lengths in the first horizontal direction of the corresponding ones of the channels that neighbor in the vertical direction, and each of first and second sidewalls of the portion of the gate structure does not contact the second epitaxial layer, the first and second sidewalls of the portion of the gate structure opposite in the first horizontal direction.

16. The semiconductor device as claimed in claim 15, wherein the source/drain layer includes silicon-germanium having p-type impurities, and a germanium concentration of the first epitaxial layer is less than a germanium concentration of the second epitaxial layer.

17. The semiconductor device as claimed in claim 15, wherein an upper surface of the second epitaxial layer protrudes from an upper surface of the first epitaxial layer in the vertical direction, and an uppermost surface of the second epitaxial layer is higher than an uppermost surface of the first epitaxial layer.

18. The semiconductor device as claimed in claim 15, wherein lengths in the first horizontal direction of respective portions of the gate structure that are between ones of the channels that neighbor in the vertical direction are different from each other.

19. The semiconductor device as claimed in claim 15, wherein a maximal length in the first horizontal direction of portions of the gate structure between ones of the channels that neighbor in the vertical direction is greater than a maximal length in the first horizontal direction of the channels.

20. A semiconductor device, comprising:
(A) a first transistor including,
(i) first channels on a first region of a substrate including the first region and a second region, the first channels spaced apart from each other in a vertical direction perpendicular to an upper surface of the substrate, each of the first channels extending in a horizontal direction parallel to the upper surface of the substrate,
(ii) a first gate structure on the first region of the substrate, the first gate structure partially covering each of the first channels, and
(iii) a first source/drain layer on the first region of the substrate, the first source/drain layer connected to each of a first sidewall and a second sidewall of the first channels, the first source/drain layer including a semiconductor material having impurities of a first conductivity type, and the first source/drain layer including,
 (a) a second epitaxial layer having a second impurity concentration, and
 (b) a first epitaxial layer covering a lower surface and first and second sidewalls of the second epitaxial layer, the first epitaxial layer having a first impurity concentration less than the second impurity concentration; and
(B) a second transistor including,
(i) second channels on the second region of the substrate, the second channels spaced apart from each other in the vertical direction, each of the second channels extending in the horizontal direction,
(ii) a second gate structure on the second region of the substrate, the second gate structure partially covering each of the second channels, and
(iii) a second source/drain layer on the second region of the substrate, the second source/drain layer connected to each of a first sidewall and a second sidewall of the second channels, the second source/drain layer including a semiconductor material having impurities of a second conductivity type different from the first conductivity type, and the second source/drain layer including,
 (a) a fourth epitaxial layer having a fourth impurity concentration, and
 (b) a third epitaxial layer covering a lower surface and first and second sidewalls of the fourth epitaxial layer, the third epitaxial layer having a third impurity concentration less than the fourth impurity concentration,
wherein a portion of each of first and second sidewalls of the first gate structure protrudes in the horizontal direction from corresponding ones of first and second sidewalls of the first channels to penetrate through a portion of the first epitaxial layer but not to contact the second epitaxial layer,
and a portion of each of first and second sidewalls of the second gate structure protrudes in the horizontal direction from corresponding ones of first and second sidewalls of the second channels to penetrate through a portion of the third epitaxial layer but do not contact the fourth epitaxial layer,
the first and second sidewalls of the first gate structures opposite in the horizontal direction, the first and second sidewalls of the first channels opposite in the horizontal direction, the first and second sidewalls of the second gate structures opposite in the horizontal direction, and the first and second sidewalls of the second channels opposite in the horizontal direction, the first and second sidewalls of the second epitaxial layer opposite in the horizontal direction, the first and second sidewalls of the fourth epitaxial layer opposite in the horizontal direction.

* * * * *